(12) United States Patent
Lampert et al.

(10) Patent No.: US 12,342,733 B1
(45) Date of Patent: Jun. 24, 2025

(54) QUANTUM DOT DEVICES WITH MAGNETIC GATES

(71) Applicant: Intel Corporation, Santa Clara, CA (US)

(72) Inventors: Lester Lampert, Portland, OR (US); Guoji Zheng, Hillsboro, OR (US); Felix Frederic Leonhard Borjans, Portland, OR (US); Ravi Pillarisetty, Portland, OR (US); Hubert C. George, Portland, OR (US); Simon Schaal, Hillsboro, OR (US); Florian Luethi, Portland, OR (US); Thomas Francis Watson, Portland, OR (US); Jeanette M. Roberts, North Plains, OR (US)

(73) Assignee: Intel Corporation, Santa Clara, CA (US)

( * ) Notice: Subject to any disclaimer, the term of this patent is extended or adjusted under 35 U.S.C. 154(b) by 520 days.

(21) Appl. No.: 17/681,528

(22) Filed: Feb. 25, 2022

Related U.S. Application Data

(60) Provisional application No. 63/289,332, filed on Dec. 14, 2021.

(51) Int. Cl.
*H10N 60/12* (2023.01)
*G06N 10/40* (2022.01)
*H10N 60/01* (2023.01)
*H10N 60/10* (2023.01)
*H10N 69/00* (2023.01)

(52) U.S. Cl.
CPC .......... *H10N 60/128* (2023.02); *G06N 10/40* (2022.01); *H10N 60/01* (2023.02); *H10N 60/11* (2023.02); *H10N 69/00* (2023.02)

(58) Field of Classification Search
CPC ...... H10N 60/128; H10N 60/11; H10N 69/00; H10N 10/40
See application file for complete search history.

(56) References Cited

U.S. PATENT DOCUMENTS

| | | | |
|---|---|---|---|
| 6,246,541 B1 * | 6/2001 | Furuichi | G11B 5/313 360/123.52 |
| 6,525,901 B1 * | 2/2003 | Kamijima | G11B 5/3967 360/123.41 |
| 2019/0043951 A1 * | 2/2019 | Thomas | H01L 29/66545 |
| 2019/0043953 A1 * | 2/2019 | George | H01L 29/0692 |
| 2019/0044048 A1 * | 2/2019 | George | H01L 29/66977 |

* cited by examiner

*Primary Examiner* — Ida M Soward
(74) *Attorney, Agent, or Firm* — Akona IP PC

(57) ABSTRACT

An array of spin qubits relies on a gradient magnetic field to ensure that the qubits are separated in frequency in order to be individually addressable. Furthermore, a strong magnetic field gradient is required to electrically drive the EDSR of the qubits. Quantum dot devices and related methods and systems that integrate magnetic materials in the gates to provide a gradient magnetic field are disclosed. Magnetic materials in different gates may be of different heights to improve frequency separation of neighboring qubits. Unlike previous approaches to quantum dot formation and manipulation, various embodiments of the quantum dot devices disclosed herein may enable improved control over magnetic fields and their gradients to realize better frequency targeting of individual qubits, help minimize adverse effects of charge noise on qubit decoherence and provide good scalability in the number of quantum dots included in the device.

20 Claims, 18 Drawing Sheets

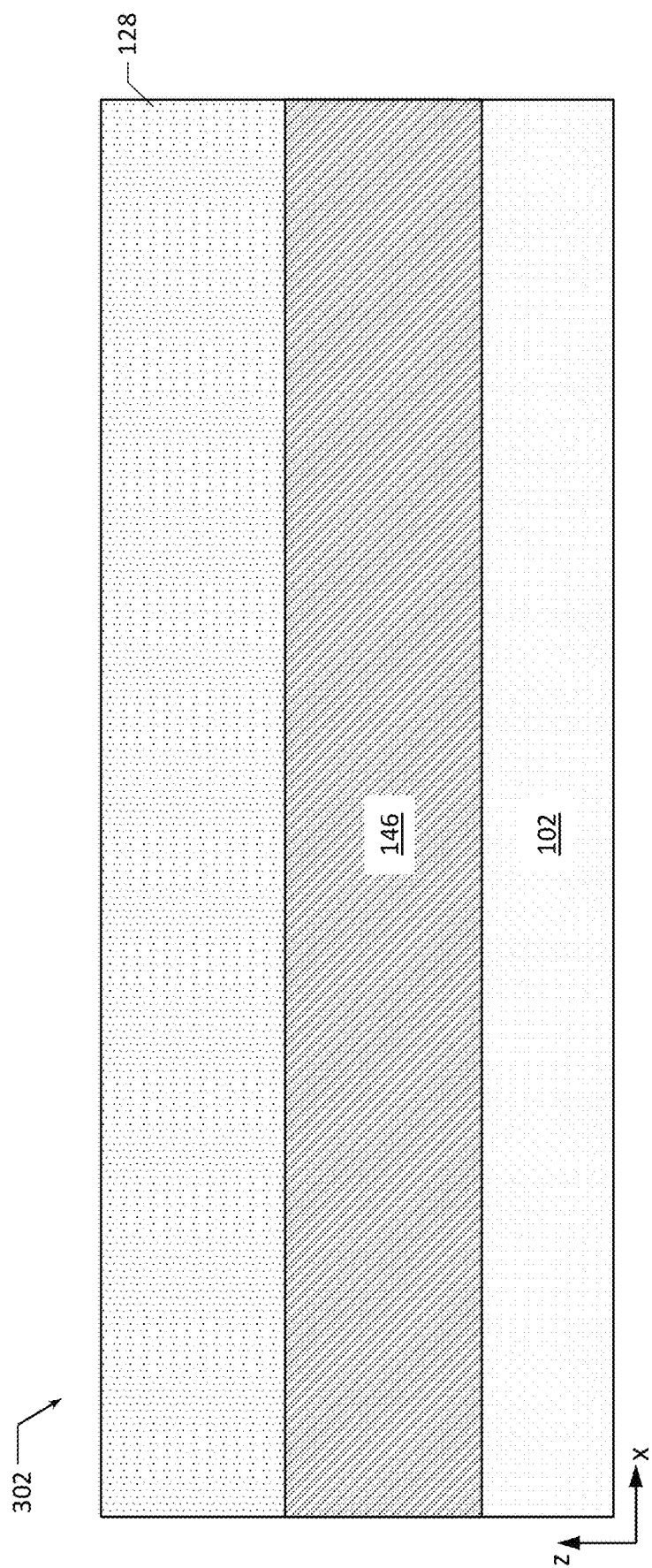

US 12,342,733 B1

QUANTUM DOT DEVICES WITH MAGNETIC GATES

RELATED APPLICATIONS

This application claims the benefit of and priority from U.S. Provisional Patent Application Ser. No. 63/289,332, titled "QUANTUM DOT DEVICES WITH MAGNETIC GATES," filed on Dec. 14, 2021, hereby incorporated by reference in its entirety.

BACKGROUND

Quantum computing refers to the field of research related to computation systems that use quantum-mechanical phenomena to manipulate data. These quantum-mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3I illustrate example stages in the manufacture of a quantum dot device with magnetic gates, according to some embodiments.

DETAILED DESCRIPTION

Figure 1:
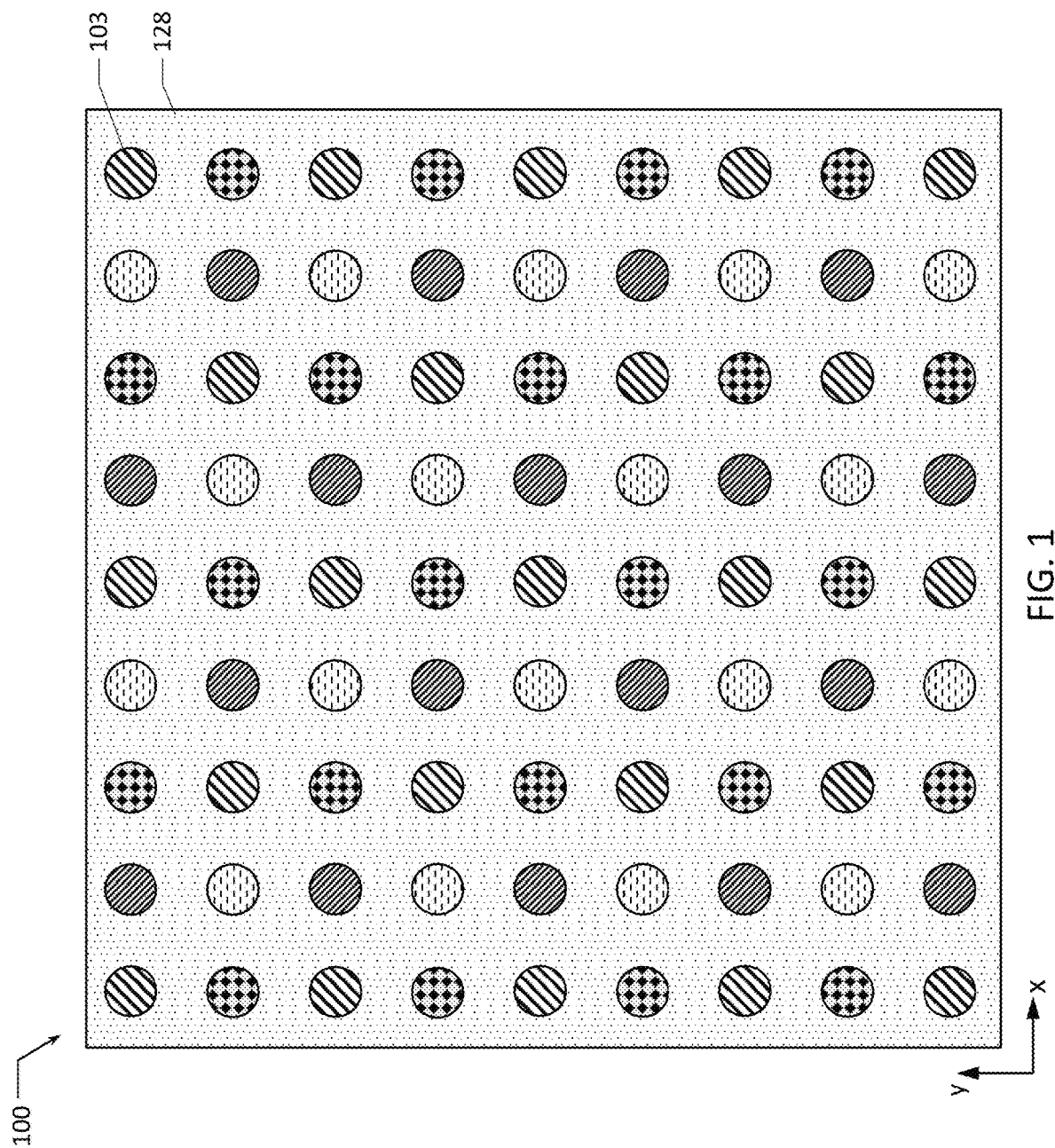
FIG. 1 is a top-down view of an example quantum dot device with magnetic gates, according to some embodiments.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating quantum dot devices with magnetic gates, proposed herein, it might be useful to first understand phenomena that may come into play in quantum computing systems. The following foundational information may be viewed as a basis from which the present disclosure may be properly explained. Such information is offered for purposes of explanation only and, accordingly, should not be construed in any way to limit the broad scope of the present disclosure and its potential applications.

As briefly described above, quantum computing, or quantum information processing, refers to the field of research related to computation systems that use quantum-mechanical phenomena to store and manipulate data. Quantum computers use so-called quantum bits, referred to as qubits (both terms "bits" and "qubits" often interchangeably refer to the values that they hold as well as to the actual devices that store the values). Similar to a bit of a classical computer, at any given time, a qubit can be either 0 or 1. However, in contrast to a bit of a classical computer, a qubit can also be 0 and 1 at the same time, which is a result of superposition of quantum states—a uniquely quantum—mechanical phenomenon. The principle of quantum superposition asserts that any two or more quantum states can be added together, i.e., superposed, to produce another valid quantum state, and that any quantum state can be represented as a sum of two or more other distinct states. Quantum entanglement is another example of a unique quantum-mechanical phenomenon.

Entanglement refers to groups of particles or quantum bits being generated or made to interact in such a way that the state of one particle becomes intertwined with that of the others. Furthermore, the quantum state of each qubit cannot be described independently. Instead, the quantum state is given for the group of entangled particles as a whole. For example, two entangled qubits may be represented by a superposition of 4 quantum states, and N entangled qubits are represented by a superposition of $2^N$ quantum states. Entanglement also contributes to the unique nature of qubits in that input data to a quantum processor can be spread out among entangled qubits, allowing manipulation of that data to be spread out as well: providing input data to one qubit results in that data being shared to other qubits with which the first qubit is entangled. Yet another example of quantum-mechanical phenomena is sometimes described as a "collapse" because it asserts that when we observe (measure) qubits, we unavoidably change their properties in that, once observed, the qubits cease to be in a state of superposition or entanglement (i.e., by trying to ascertain anything about the particles, we collapse their state) and collapse to one of the $2^N$ quantum states.

Put simply, superposition postulates that a given qubit can be simultaneously in two states; entanglement postulates that two qubits can be related in that they are able to instantly coordinate their states irrespective of the distance between them in space and time so as to exist in a superposition of 4 states or in the case of N qubits in a superposition of $2^N$ quantum states; and collapse postulates that when one observes a qubit, one unavoidably changes the state of the qubit and its entanglement with other qubits. These unique phenomena make manipulation of data in quantum computers significantly different from that of classical computers (i.e., computers that use phenomena of classical physics).

Another challenge that is unique to quantum computers and does not arise in classical computers resides in protecting qubits from decoherence so that they can stay in their information-holding states long enough to perform the necessary calculations and read out the results. For this reason, qubits are often operated at cryogenic temperatures, typically just a few degrees Kelvin or even just a few millikelvin above absolute zero, because at cryogenic temperatures thermal energy is low enough to not cause spurious excitations, which is thought to help minimize qubit decoherence.

The foregoing illustrates that the ability to manipulate and read out quantum states, making quantum-mechanical phenomena visible and traceable, and the ability to deal with and improve on the fragility of quantum states of a qubit present unique challenges not found in classical computers. These challenges explain why so many current efforts of the industry and the academics continue to focus on a search for new and improved physical systems whose functionality could approach that expected of theoretically designed qubits. Physical systems for implementing qubits that have been explored until now include, e.g., semiconducting qubits including those that rely on formation of quantum dots (e.g., spin qubits and charge qubits), superconducting qubits (e.g., flux qubits or transmon qubits, the latter sometimes simply referred to as "transmons"), photon polarization qubits, single trapped ion qubits, etc. Out of these, devices that rely on formation of quantum dots (referred to herein as "quantum dot devices"), e.g., spin qubits, are particularly promising for large-scale qubit implementation.

In general, quantum dot devices enable formation of quantum dots to serve as quantum bits (i.e., as qubits, e.g., as spin qubits) in a quantum computing device, as well as the control of these quantum dots to perform quantum logic operations. To that end, quantum dot devices implement multiple terminals, such as gate terminals of various types of gates (e.g., barrier gates, plunger gates, and accumulation gates) as well as terminals for making electrical contact with doped regions of a semiconductor material (which may be referred to as "source terminals" and "drain terminals"). DC bias control signals and AC pulses applied to various terminals may be used to control formation of quantum dots in such devices. Single-electron transistor (SET) detectors, provided proximate to quantum dot qubits, may then be used to detect states of various qubits. An array of quantum dot qubits (e.g., an array of spin qubits) relies on a gradient magnetic field to ensure that the qubits are separated in frequency in order to be individually addressable. Furthermore, a strong magnetic field gradient is required to electrically drive the electric dipole spin resonance (EDSR) of the qubits. In laboratory settings, lines or planes of magnetic materials provided proximate to quantum dot qubits have been used to generate magnetic fields in a quantum dot device. Inventors of the present disclosure realized that such approaches may not be suitable for large-scale integration of arrays of many spin qubits necessary to make quantum computing commercially feasible. Embodiments of the present disclosure provide quantum dot devices and related methods and systems that integrate magnetic materials such as cobalt, nickel, or various magnetic alloys (e.g., ferromagnetic materials and/or alloys) in the gates in order to provide a gradient magnetic field. Magnetic materials in different gates may be of different heights in order to improve frequency separation of neighboring qubits. Unlike previous approaches to quantum dot formation and manipulation, various embodiments of the quantum dot devices disclosed herein may enable improved control over magnetic fields and their gradients to realize better frequency targeting of individual qubits, help minimize adverse effects of charge noise on qubit decoherence and provide good scalability in the number of quantum dots included in the device.

In various embodiments, quantum dot devices with magnetic gates as described herein may be implemented as components associated with a quantum integrated circuit (IC). Such components may include those that are mounted on or embedded in a quantum IC, or those connected to a quantum IC. The quantum IC may be either analog or digital and may be used in a number of applications within or associated with quantum systems, such as e.g., quantum processors, quantum amplifiers, quantum sensors, etc., depending on the components associated with the IC. The IC may be employed as part of a chipset for executing one or more related functions in a quantum system.

In order to provide substantially lossless connectivity to, from, and between the qubits, some or all of the electrically conductive portions of quantum circuit assemblies described herein, in particular to, from, and between various gates and conductive vias described herein, as well as other components of quantum circuits, may be made from one or more superconductive materials. However, some or all of these electrically conductive portions could be made from electrically conductive materials which are not superconductive. In the following, unless specified otherwise, reference to an electrically conductive material implies that a superconductive material can be used, and vice versa. Furthermore, materials described herein as "superconductive/superconducting materials" may refer to materials, including alloys of materials, that exhibit superconducting behavior at typical qubit operating conditions (e.g., materials which exhibit superconducting behavior at very low temperatures at which qubits typically operate), but which may or may not exhibit such behavior at higher temperatures (e.g., at room temperatures). Examples of such materials include aluminum (Al), niobium (Nb), niobium nitride (NbN), titanium nitride (TIN), niobium titanium nitride (NbTiN), indium (In), and molybdenum rhenium (MoRe), all of which are particular types of superconductors at qubit operating temperatures, as well as their alloys.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, such as e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

In the following detailed description, various aspects of the illustrative implementations will be described using terms commonly employed by those skilled in the art to convey the substance of their work to others skilled in the art. For example, the terms "oxide," "carbide," "nitride," etc. refer to compounds containing, respectively, oxygen, carbon, nitrogen, etc.; the term "high-k dielectric" refers to a material having a higher dielectric constant than silicon oxide; the term "low-k dielectric" refers to a material having a lower dielectric constant than silicon oxide. The term "insulating" means "electrically insulating," the term "conducting" means "electrically conducting," unless otherwise specified. Furthermore, the term "connected" may be used to describe a direct electrical or magnetic connection between the things that are connected, without any intermediary devices, while the term "coupled" may be used to describe either a direct electrical or magnetic connection between the things that are connected, or an indirect connection through one or more passive or active intermediary devices. A first component described to be electrically coupled to a second component means that the first component is in conductive contact with the second component (i.e., that a conductive pathway is provided to route electrical signals/power between the first and second components). As used herein, a "magnet line" refers to a magnetic field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Furthermore, as used herein, terms indicating what may be considered an idealized behavior, such as e.g., "lossless" (or "low-loss") or "superconductive/superconducting," are intended to cover functionality that may not be exactly ideal but is within acceptable margins for a given application. For example, a certain level of loss, either in terms of nonzero electrical resistance or nonzero amount of spurious two-level systems (TLSs) may be acceptable such that the resulting materials and structures may still be referred to by these "idealized" terms. Specific values associated with an acceptable level of loss are expected to change over time as fabrication precision will improve and as fault-tolerant schemes may become more tolerant of higher losses, all of which are within the scope of the present disclosure.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). The terms "substantially," "close," "approximately," "near," and "about," generally refer to being within +/−20% (e.g., within +/−10% or within +/−2%) of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% (e.g., within +/−2-10%) of a target value based on the context of a particular value as described herein or as known in the art.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Quantum dot devices enable formation of quantum dots to serve as quantum bits (i.e., as qubits) in a quantum computing device, as well as formation of quantum dots to serve as a part of one or more SETs for reading/detecting states of said qubits. In particular, quantum dot devices described herein include two-dimensional arrays of quantum dot formation regions (e.g., some quantum dot formation regions being regions where quantum dots for serving as qubits are formed, while other quantum dot formation regions being regions where quantum dots for serving as a part of one or more SETs are formed).

In some implementations, quantum dot formation regions may be defined by an insulating material provided over a continuous quantum well stack, the insulating material including openings (e.g., via openings) extending toward the continuous quantum well stack, and portions of gate electrode materials of different gates being at least partially in the openings. In such implementations, even though the quantum well stack is continuous along a portion of a plane, i.e., continuous in a two-dimensional plane, confinement of quantum dot formation in the quantum well stack is achieved by the confinement of the gates to their locations as defined by the openings in the insulating material. A quantum dot formed in such a quantum dot device may be constrained in the x-direction and in the y-direction by one or more gates provided in the openings in the insulating material, and in the z-direction by the quantum well layer, as discussed in detail herein. Quantum dot devices with gates provided in openings in an insulating material provide strong spatial localization of the quantum dots (and therefore good control over quantum dot interactions and manipulation), good scalability in the number of quantum dots included in a quantum dot device, and/or design flexibility in making electrical connections to the quantum dot devices to integrate the quantum dot devices in larger computing devices. One example of such a quantum dot device is shown in FIG. 1, illustrating a top-down view of an example quantum dot device 100 with magnetic gates, according to some embodiments.

The quantum dot device 100 may include a quantum well stack disposed on a base. Such a quantum well stack and a support structure are not seen in the top-down view of FIG. 1 but are shown in the cross-sectional side views of FIGS. 3A-31 as a quantum well stack 146 and a support structure 102. An insulating material 128 may be disposed above the quantum well stack 146, and multiple openings 103 in the insulating material 128 may extend toward the quantum well stack 146. Only one of the openings 103 is labeled in FIG. 1 in order to not clutter the drawing, although multiple openings 103 are shown in FIG. 1 as circles within the insulating material 128. Magnetic materials (e.g., ferromagnetic materials) may be provided within the openings 103 to serve as gate electrode materials of the gates formed in the openings 103, thus forming quantum dot gates of the quantum dot device 100. Quantum dots that serve as qubits (e.g., spin qubits) may then form in portions of the quantum well stack under some or all of the gates within the openings 103. As described below, magnetic materials in different openings 103 may be recessed to different levels in order to improve frequency separation of neighboring qubits. FIG. 1 uses different patterns within the openings 103 to indicate different heights of the magnetic materials of different gates. Although four different heights of magnetic materials are illustrated in FIG. 1, this is simply for ease of illustration, and, in other embodiments, more than four or less than four (e.g., two or three) different heights of magnetic materials may be implemented in the quantum dot device 100. In addition, although FIG. 1 illustrates certain repeatable arrangements of gates with different heights of magnetic materials, in other embodiments any of the gates provided within the openings 103 may include any height of magnetic materials as is suitable for a particular design. Still further, while FIG. 1 illustrates the openings 103 arranged in a regular grid of rows and columns, in other embodiments of the quantum dot device 100, the openings 103 as described herein may be arranged in any two-dimensional array geometry. Further, the use of the term "opening" should not be interpreted to require that the insulating material 128 is deposited first and then a portion of that insulating material 128 is excavated to form the opening 103 prior to depositing a magnetic material in the opening. Although such fabrication approach may be used in some embodiments, as is illustrated in FIGS. 3A-31, in other embodiments, the insulating material 128 may be deposited before or after deposition of the magnetic material that will ultimately be in the opening 103 in the final device.

The quantum dot devices 100 disclosed herein may be used to form electron-type or hole-type quantum dots. Note that the polarity of the voltages applied to the quantum dot gates of the IC device (e.g., the quantum dot gates formed by the openings 103 with the magnetic materials as described herein, although some of the openings 103 may be filled with non-ferromagnetic materials instead, as described below) to form quantum wells/barriers depends on the charge carriers used in the quantum dot device 100. In embodiments in which the charge carriers are electrons (and thus the quantum dots are electron-type quantum dots), amply negative voltages applied to a quantum dot gate may increase the potential barrier under the gate, and amply positive voltages applied to a quantum dot gate may decrease the potential barrier under the gate (thereby forming a potential well in which an electron-type quantum dot may form). In embodiments in which the charge carriers are holes (and thus the quantum dots are hole-type quantum dots), amply positive voltages applied to a quantum dot gate may increase the potential barrier under the gate, and amply negative voltages applied to a quantum dot gate may decrease the potential barrier under the gate (thereby forming a potential well in which a hole-type quantum dot may form). The quantum dot devices 100 disclosed herein may be used to form electron-type or hole-type quantum dots.

Voltages may be applied to each of the quantum dot gates separately to adjust the potential energy in the quantum well stack 146 under the gates, and thereby control the formation of quantum dots under individual ones of the quantum dot gates. Additionally, the relative potential energy profiles under different ones of the quantum dot gates allow the quantum dot device 100 to tune the potential interaction between quantum dots under adjacent gates. For example, if two adjacent quantum dots (e.g., one quantum dot under one quantum dot gate and another quantum dot under an adjacent quantum dot gate) are separated by only a short potential barrier, the two quantum dots may interact more strongly than if they were separated by a taller potential barrier. Since the depth of the potential wells/height of the potential barriers under each quantum dot gate may be adjusted by adjusting the voltages on the respective gates, the differences in potential between adjacent quantum dot gate may be adjusted, and thus the interaction tuned. In some applications, some of the quantum dot gates of the quantum dot device 100 may be used as plunger gates to enable the formation of quantum dots under these gates, while some other ones of the quantum dot gates may be used as barrier gates to adjust the potential barrier between quantum dots formed under adjacent plunger gates.

Although not specifically shown in the present drawings, the quantum well stack 146 may include doped regions that may serve as a reservoir of charge carriers for the quantum dot device 100. For example, an n-type doped region may supply electrons for electron-type quantum dots, and a p-type doped region may supply holes for hole-type quantum dots. In some embodiments, an interface material may be disposed at a surface of a doped region. The interface material may facilitate electrical coupling between a conductive contact (e.g., a conductive via, as discussed herein) and the doped region. The interface material may be any suitable metal-semiconductor ohmic contact material; for example, in embodiments in which the doped region includes silicon, the interface material may include nickel silicide, aluminum silicide, titanium silicide, molybdenum silicide, cobalt silicide, tungsten silicide, or platinum silicide. In some embodiments, the interface material may be a non-silicide compound, such as titanium nitride. In some embodiments, the interface material may be a metal (e.g., aluminum, tungsten, or indium).

Although also not specifically shown in the present drawings, conductive vias and lines may make contact with the quantum dot gates and to the doped regions of the quantum dot device 100, to enable electrical connection to the quantum dot gates and the doped regions to be made in desired locations. The conductive vias and lines included in a quantum dot device 100 may include any suitable materials, such as copper, tungsten (deposited, e.g., by chemical vapor deposition (CVD)), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions (e.g., via the conductive vias and the interface material) to cause current to flow through the doped regions and through a quantum well layer of the quantum well stack 146 (discussed in further detail below with reference to FIGS. 7-9). When the doped regions are doped with an n-type material, this voltage may be positive; when the doped regions are doped with a p-type material, this voltage may be negative. The magnitude of this bias voltage may take any suitable value (e.g., between about 0.25 volts and 2 volts).

Also not specifically shown in the present drawings, in some embodiments, the quantum dot device 100 may include one or more magnet lines. The magnet lines may be formed of a conductive material and may be used to conduct current pulses that generate magnetic fields to influence the spin states of one or more of the quantum dots that may form in the quantum well stack 146. In some embodiments, the magnet line may conduct a pulse to reset (or "scramble") nuclear and/or quantum dot spins. In some embodiments, the magnet line may conduct a pulse to initialize an electron in a quantum dot in a particular spin state. In some embodiments, the magnet line may conduct current to provide a continuous, oscillating magnetic field to which the spin of a qubit may couple. The magnet line may provide any suitable combination of these embodiments, or any other appropriate functionality.

In some embodiments, the magnet line may be formed of copper. In some embodiments, the magnet line may be formed of a superconductor, such as aluminum. The magnet line may be non-coplanar with the openings 103, and is also non-coplanar with the quantum dot gates of the quantum dot device 100. In some embodiments, the magnet line may be spaced apart from the quantum dot gates of the quantum dot device 100, in the direction of the z-axis of the example coordinate system shown, by a distance that may take any suitable value (e.g., based on the desired strength of magnetic field interaction with particular quantum dots); in some embodiments, the distance may be between about 25 nanometers and 1 micron (e.g., between about 50 nanometers and 200 nanometers).

In some embodiments, the magnet line may be formed of a magnetic material. For example, a magnetic material (such as cobalt) may be deposited in a trench in the insulating material 128 (or in an insulating material provided above the quantum dot gates of the quantum dot device 100) to provide a permanent magnetic field in the quantum dot device 100.

The magnet line may have any suitable dimensions. For example, the magnet line may have a thickness between about 25 nanometers and 100 nanometers. The magnet line may have a width between about 25 nanometers and 100 nanometers. In some embodiments, the width and thickness of a magnet line may be substantially equal to, respectively, the width and thickness of other conductive lines in the quantum dot device 100 (not shown) used to provide electrical interconnects, as known in the art. The magnet line may have a length that may depend on the number and dimensions of the quantum dot gates that are to form quantum dots with which the magnet line is to interact. The magnet lines may be substantially linear in some embodiments, but this need not be the case in other embodiments; in general, the magnet lines of the quantum dot devices 100 may take any suitable shape. Conductive vias may contact the magnet lines in the quantum dot device 100.

Figure 2:
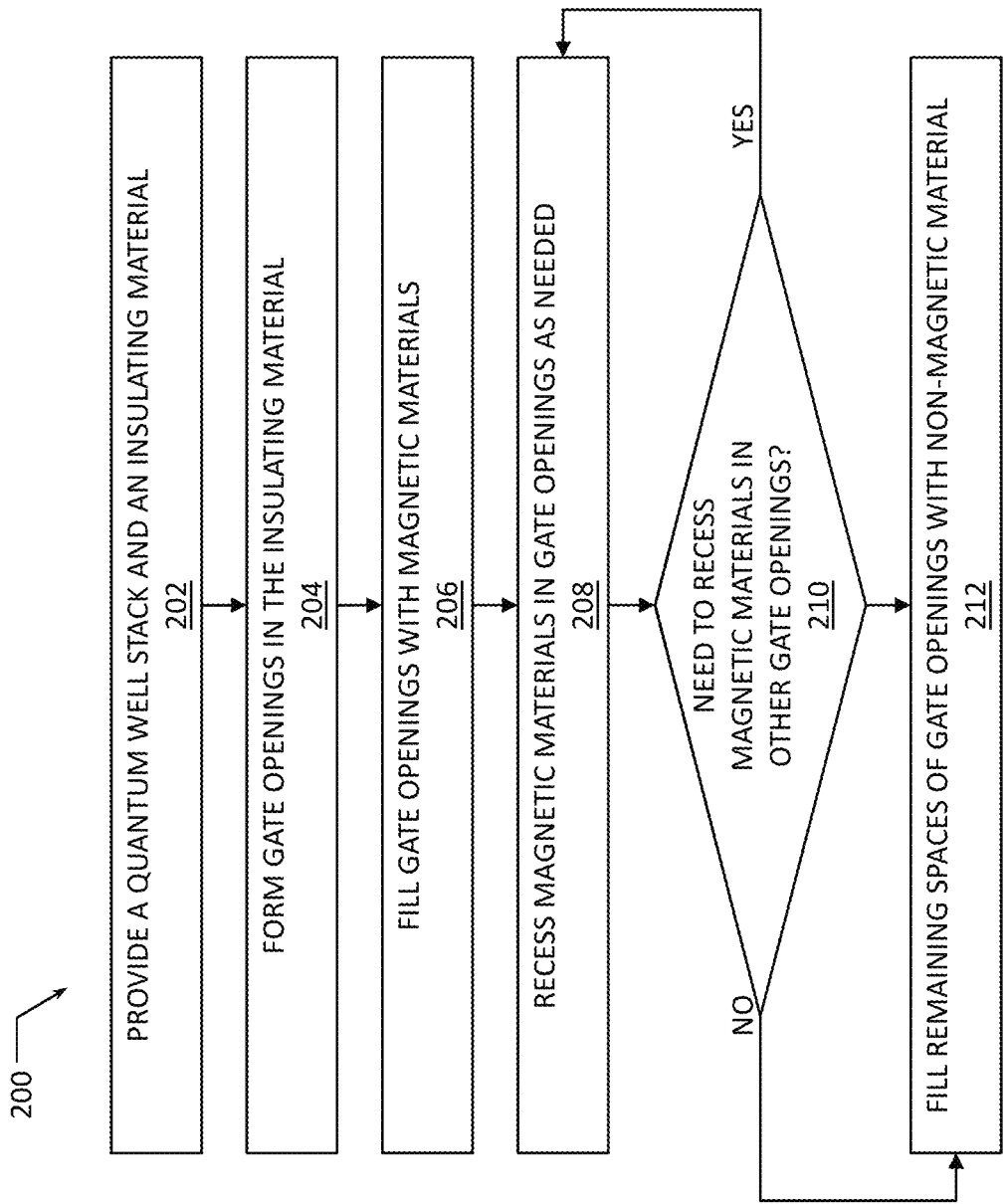
FIG. 2 is a flow diagram of a method of manufacturing a quantum dot device with magnetic gates, according to some embodiments.

FIG. 2 is a flow diagram of a method 200 of manufacturing a quantum dot device with magnetic gates, according to some embodiments. The method 200 may be used to fabricate the quantum dot device 100 as described herein.

Although the operations of the method 200 are illustrated once each and in a particular order, the operations may be performed in any suitable order and repeated as desired. For example, one or more operations may be performed in parallel to manufacture multiple quantum dot devices with magnetic gates substantially simultaneously. In addition, the example manufacturing method 200 may include other operations not specifically shown in FIG. 2, such as various cleaning or planarization operations as known in the art. For example, in some embodiments, the support structure 102, as well as layers of various other materials subsequently deposited thereon, may be cleaned prior to, after, or during any of the processes of the method 200 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the intermediate IC devices described herein may be planarized prior to, after, or during any of the processes of the method 200 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

FIGS. 3A-3I illustrate example stages in the manufacture of a quantum dot device with magnetic gates according to the method 200 of FIG. 2, in accordance with some embodiments. Each of FIGS. 3A-3I provides a cross-sectional side view, i.e., a view in the x-z plane of the example coordinate system shown in the present drawings.

The method 200 may begin with a process 202 that includes providing a quantum well stack and an insulating material over the quantum well stack. An IC device 302 of FIG. 3A illustrates an example result of performing the process 202. The IC device 302 includes a support structure 102, a quantum well stack 146 over the support structure 102, and an insulating material 128 over the quantum well stack 146.

The support structure 102 may, e.g., be the wafer 1100 of FIG. 10, discussed below, and may be, or be included in, a die, e.g., the singulated die 1102 of FIG. 10, discussed below. The support structure 102 may be a semiconductor substrate composed of semiconductor material systems including, for example, n-type or p-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure 102 may be a sapphire substrate. In some embodiments, the support structure 102 may be a printed circuit board (PCB) substrate. Although a few examples of materials from which the support structure 102 may be formed are described here, any material that may serve as a foundation upon which a quantum dot device with magnetic gates as described herein may be built falls within the spirit and scope of the present disclosure.

The quantum well stack 146 may include a quantum well layer (not shown in FIGS. 3A-3I, but discussed below with reference to the quantum well layer 152 of FIGS. 7-9). The quantum well layer included in the quantum well stack 146 may be arranged normal to the z-direction, and may provide a layer in which a two-dimensional electron gas (2DEG) may form to enable the generation of one or more quantum dots during operation of the quantum dot device 100, as discussed in further detail below.

The insulating material 128 may be a dielectric material (e.g., an interlayer dielectric). In some embodiments, the insulating material 128 may be a CVD or flowable CVD oxide. In other embodiments, the insulating material 128 may include low-k dielectric materials such as silicon oxide, carbon-doped oxide, silicon nitride, organic polymers such as perfluorocyclobutane or polytetrafluoroethylene, fused silica glass (FSG), and organosilicates such as silsesquioxane, siloxane, or organosilicate glass. In other embodiments, the insulating material 128 may include high-k dielectric materials including elements such as hafnium, silicon, oxygen, titanium, tantalum, lanthanum, aluminum, zirconium, barium, strontium, yttrium, lead, scandium, niobium, and zinc. Examples of high-k materials that may be used for this purpose may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Figure 3B:
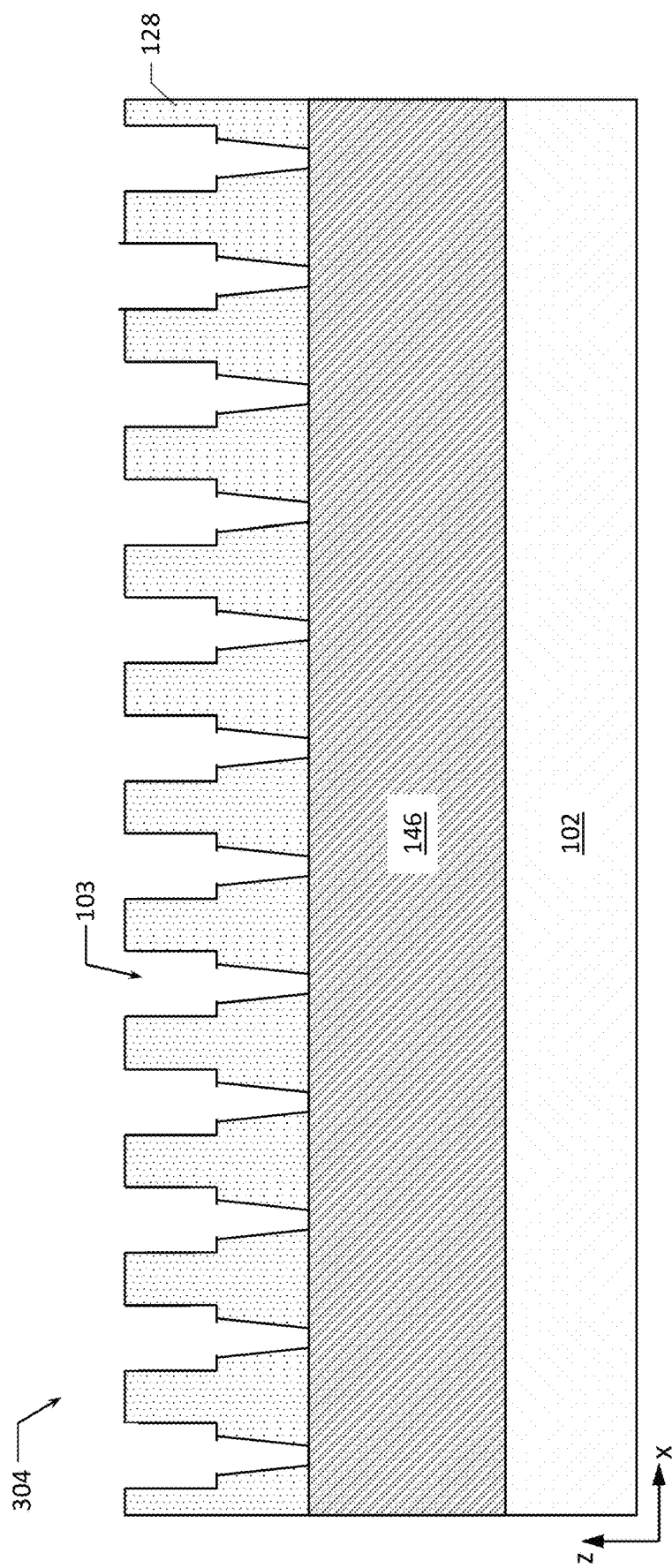

The method 200 may include a process 204 that includes providing gate openings in the insulating material over the quantum well stack. An IC device 304 of FIG. 3B illustrates an example result of performing the process 204. The IC device 304 illustrates openings 103 in the insulating material 128 over the quantum well stack 146 (only one of the openings 103 being labeled in FIG. 3B in order to not clutter the drawings). The openings 103 as shown in FIG. 3B may be examples of the opening 103 of the IC device 100. The particular number and arrangement of the openings 103 shown in FIG. 3B is simply illustrative, and any suitable number of the openings 103 may be used.

The quantum well layer itself may provide a geometric constraint on the z-location of quantum dots in the quantum well stack 146. To control the x- and y-location of quantum dots in the quantum well stack 146, voltages may be applied to gates disposed at least partially in the openings 103 above the quantum well stack 146 to adjust the energy profile along the x- and y-direction and thereby constrain the x- and y-location of quantum dots within quantum wells. The dimensions of the openings 103 may take any suitable values. For example, in some embodiments, the openings 103 may each have a width, measured in an x-y plane of the example coordinate system shown in the present drawings, between about 5 nanometers and 500 nanometers. In some embodiments, the openings 103 may each have a depth, measured along the z-axis of the example coordinate system shown in the present drawings, between about 2 nanometers and 500 nanometers (e.g., between about 70 nanometers and 350 nanometers, or equal to about 300 nanometers). In some embodiments, the openings 103 may be spaced apart by a distance 160 between about 40 nanometers and 500 nanometers.

Figure 3C:
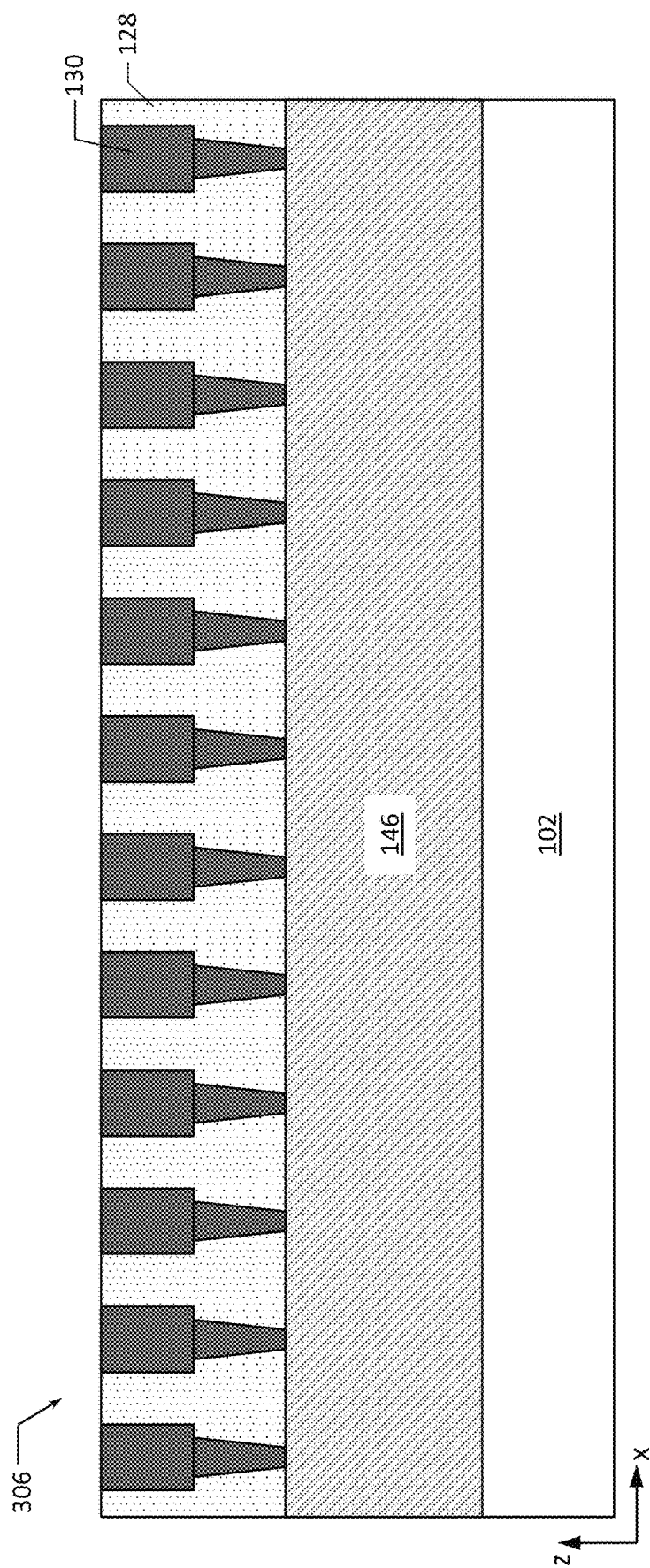

The method 200 may include a process 206 that includes filling the gate openings in the insulating material with one or more magnetic materials. An IC device 306 of FIG. 3C illustrates an example result of performing the process 206. The IC device 306 illustrates the openings 103 in the insulating material 128 over the quantum well stack 146 being filled with a magnetic material 130. In various embodiments the magnetic material 130 may include a single magnetic material or a combination of magnetic materials, and different ones of the openings 103 may be filled with magnetic materials 130 of the same or different material compositions. Examples of magnetic materials that may be used as the magnetic material 130 include one or more of cobalt, nickel, iron, and various magnetic alloys such as nickel-iron alloy (also known as "permalloy") or cobalt-iron alloy (also known as "CoFe"). Other magnetic materials that may be used as the magnetic material 130 include one or more of AlNiCo, NdFeB, SmCo, steel, Mn, Gd, Tb, Dy, MnBi, MnSb, and Nd2Fe14B. The process 206 may include performing a planarization (e.g., CMP or any other polishing technique) to remove excess of the magnetic material 130 after it was deposited, e.g., to expose the upper surfaces of the insulating material 128 that may be covered with the magnetic material 130 as a result of the deposition of the magnetic material 130.

Figure 3D:
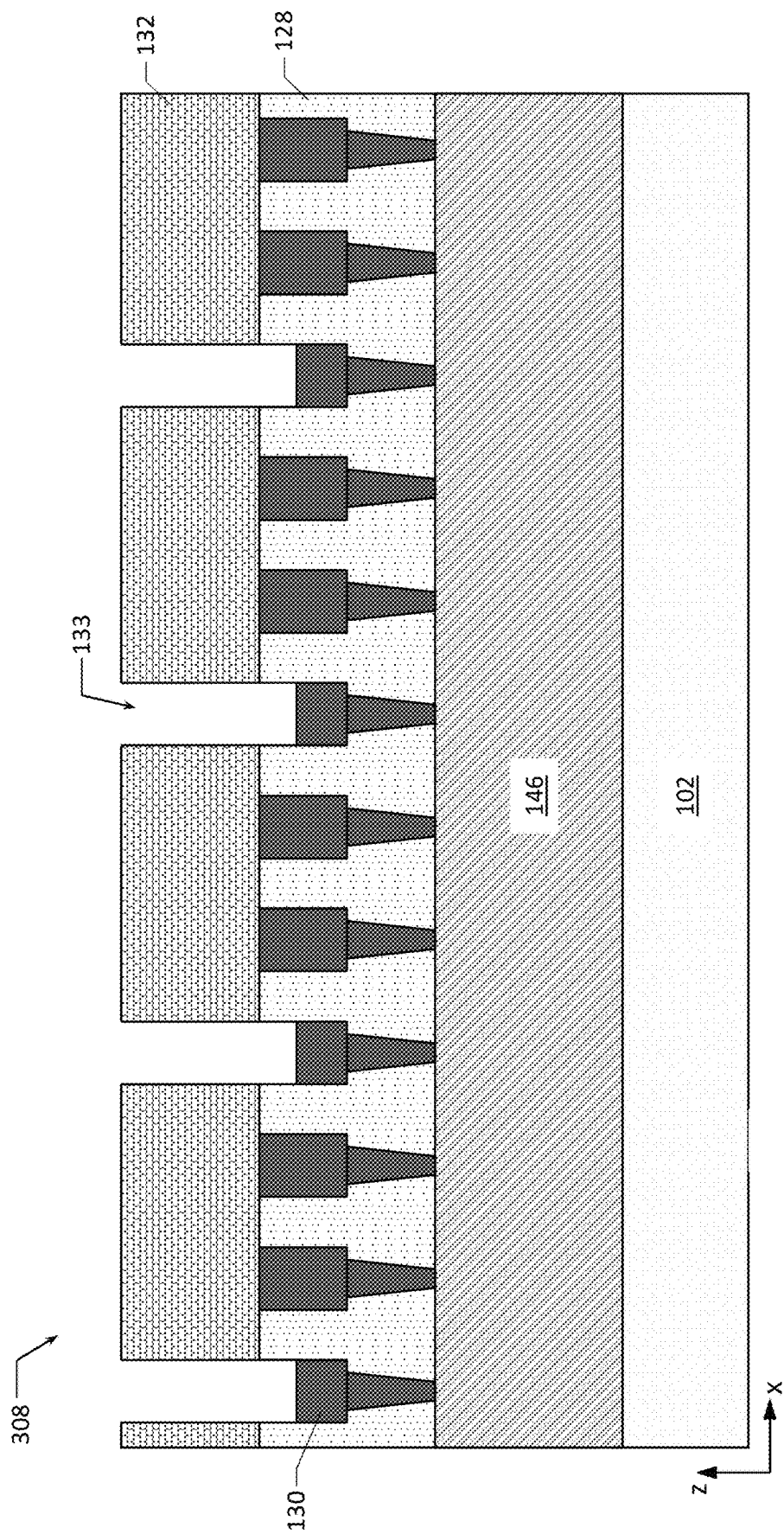

The method 200 may include a process 208 that includes recessing the magnetic materials in various gate openings as needed for a particular design. An IC device 308 of FIG. 3D illustrates an example result of performing the process 208. The IC device 308 illustrates an example where a mask material 132 may be provided over the openings 103 filled with the magnetic material 130 after the process 206 was finished, where openings 133 may be formed in the mask material 132 to expose the magnetic material 130 of select openings 103 that should be recessed (only one of the openings 133 being labeled in FIG. 3D in order to not clutter the drawings), and where the pattern provided by the openings 133 in the mask material 132 may be used to remove some of the magnetic material 130 from the gates that are exposed by the openings 133. The particular number and arrangement of the openings 133 and the particular depth of the recess of the magnetic material 130 in the gates exposed by the openings 133 as shown in FIG. 3D is simply illustrative, and any suitable number of the openings 133 may be used. In various embodiments, immersion lithography and/or extreme ultraviolet (EUV) techniques may be used in the process 208. The magnetic material 130 may be removed using any suitable etchants that selectively etch the magnetic material 130 without substantially etching other materials of the IC device.

Figure 3E:
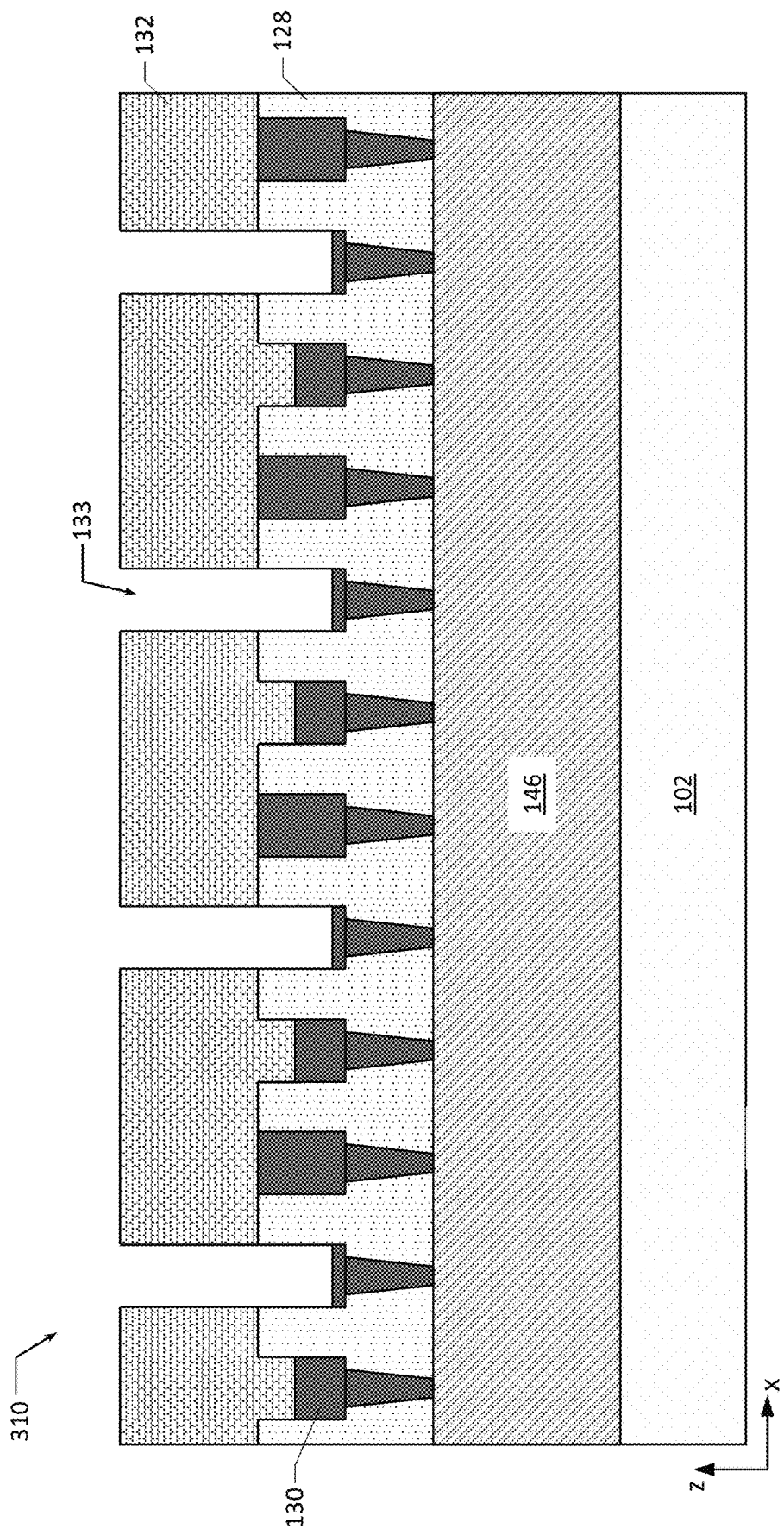
Figure 3F:
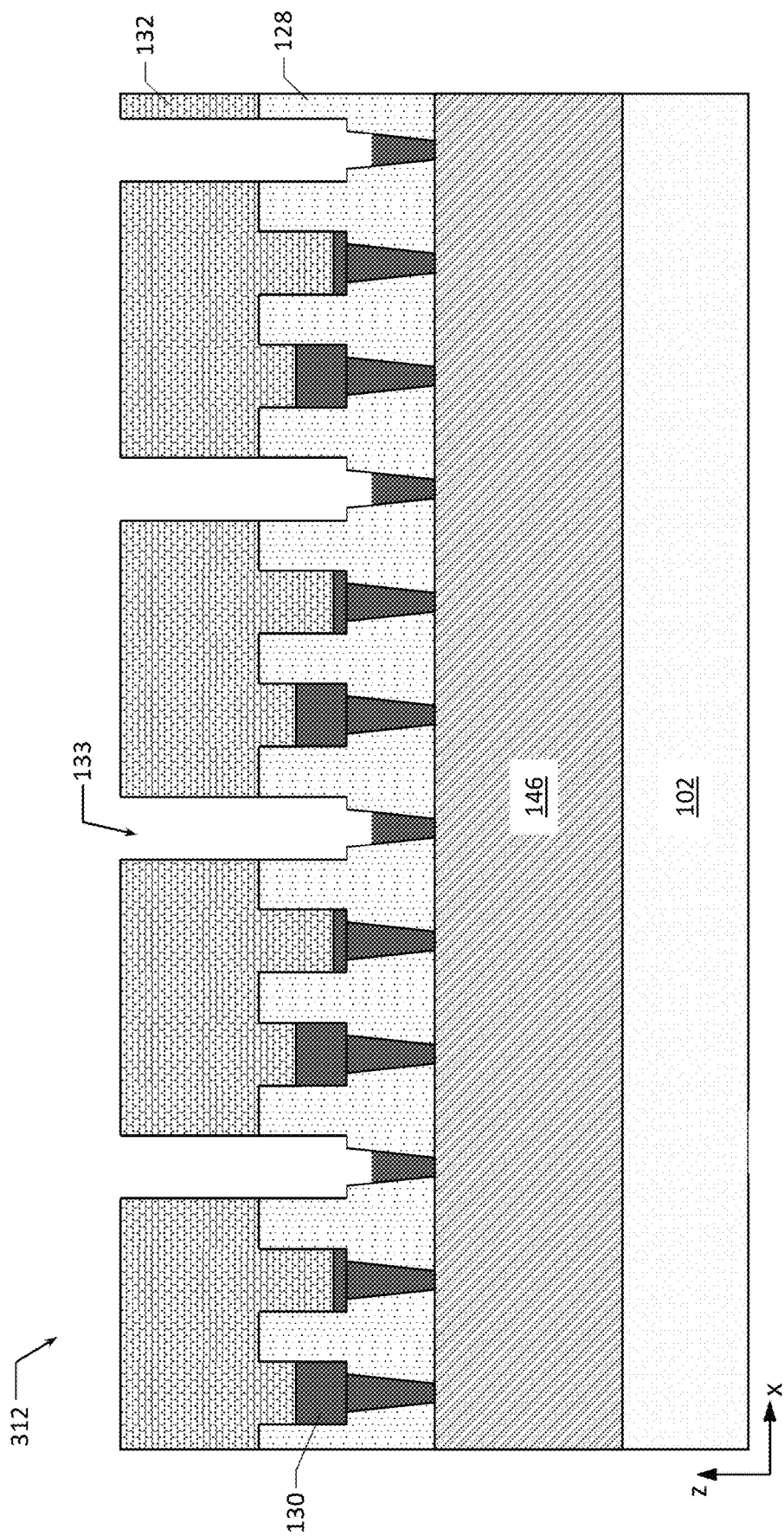

As a result of performing the process 208 all of the magnetic materials 130 exposed by the openings 133 may be recessed to a substantially the same height. This already allows to realize a quantum dot device where two different heights of magnetic materials 130 may be realized (one height for the gates where the magnetic materials 130 were recessed in the process 208 and another height for the gates where the magnetic materials 130 were not recessed in the process 208 because those gates were not exposed by the openings 133 in the mask material 132). If a particular design of a quantum dot device requires additional levels of granularity in the height of the magnetic materials 130, then the method 200 may include a process 210 that includes determining whether magnetic materials in other gate openings should be recessed. As shown in FIG. 2, if so, then the method 200 may proceed with repeating the process 208. A result of repeating the process 208 one time is shown with an IC device 310 of FIG. 3E, illustrating that the openings 133 that were present in the previous iteration of the process 208 (i.e., the openings 133 that were shown in FIG. 3D) may be closed with the mask material 132 and new openings 133 may be provided over select gates, to recess the magnetic materials 130 of these gates to the desired height. A result of repeating the process 208 for the second time is shown with an IC device 312 of FIG. 3F, illustrating that the openings 133 that were present in the previous iteration of the process 208 (i.e., the openings 133 that were shown in FIG. 3E) may be closed with the mask material 132 and new openings 133 may be provided over select gates, to recess the magnetic materials 130 of these gates to the desired height.

Figure 3G:
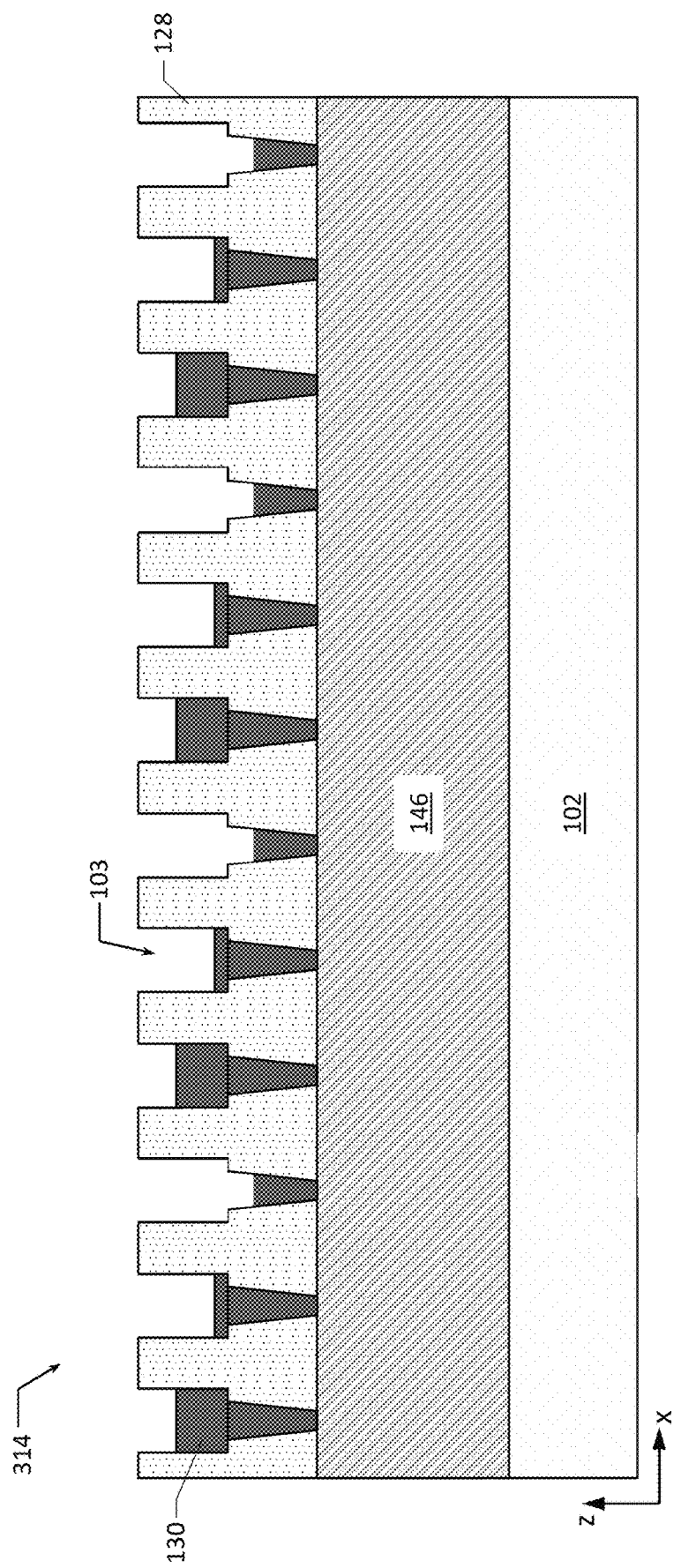
Figure 3H:
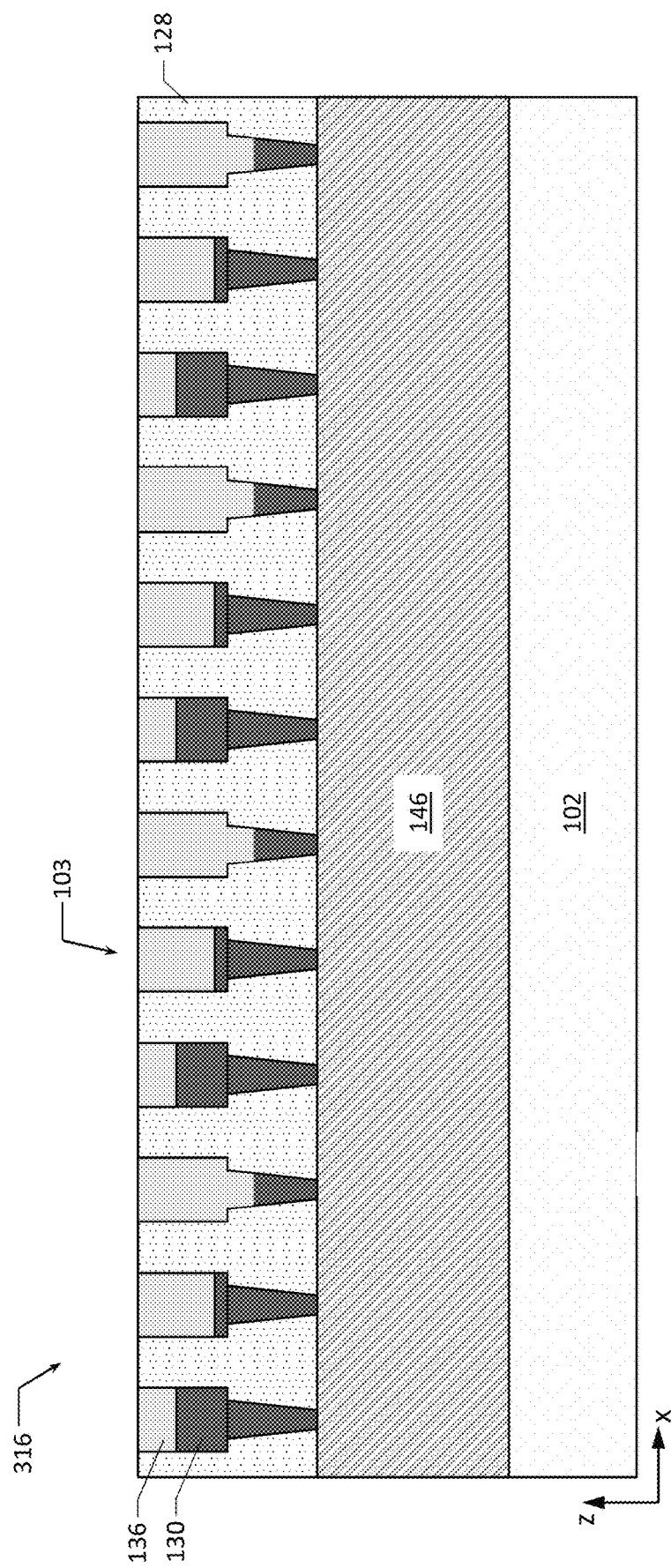

When it is no longer desired to recess magnetic materials in other gate openings, the method 200 may proceed with a process 212 that includes filling remaining spaces of the gate openings with non-ferromagnetic materials for providing electrical contacts to the magnetic material 130 of the gates. FIG. 3G illustrates an IC device 314 which is substantially the same as the one resulting from the last time the process 208 was performed, except that the mask material 132 is removed before gate fill with non-ferromagnetic materials is performed. FIG. 3H illustrates an IC device 316 in which the openings that resulted from the removal of the mask material 132 are filled with a non-ferromagnetic material 136. The process 212 may include performing a planarization (e.g., CMP or any other polishing technique) to remove excess of the non-ferromagnetic material 136 after it was deposited, e.g., to expose the upper surfaces of the insulating material 128 that may be covered with the non-ferromagnetic material 136 as a result of the deposition of the non-ferromagnetic material 136. In various embodiments, the non-ferromagnetic material 136 may include non-ferromagnetic metals such as ruthenium, palladium, platinum, hafnium, zirconium, titanium, tantalum, aluminum, alloys of these metals, as well as conductive metal oxides (e.g., ruthenium oxide) and carbides of these metals.

Figure 3I:
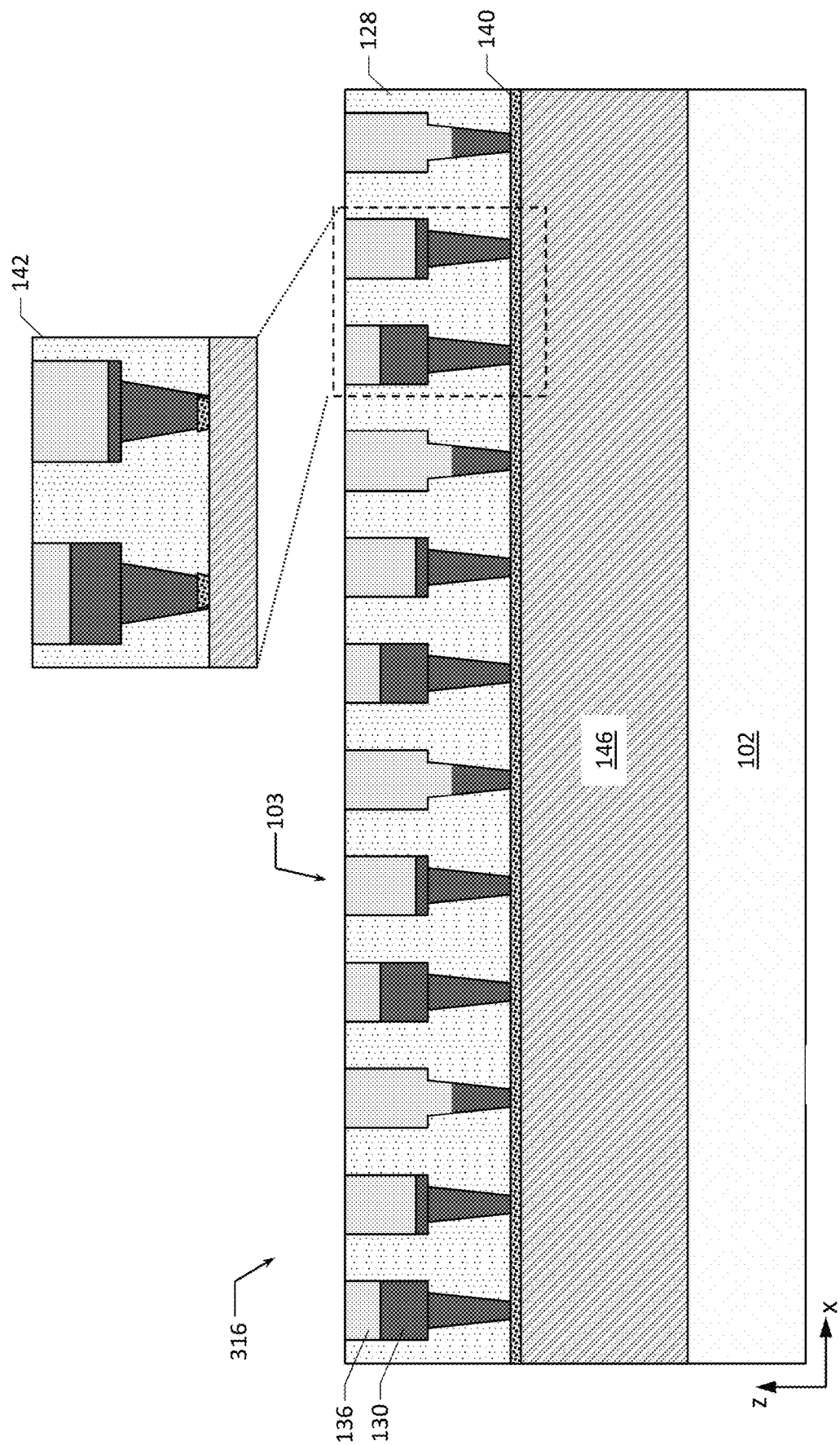

Although not specifically shown in FIGS. 3A-3H, in some embodiments, a gate dielectric may be disposed between the quantum well stack 146 and the magnetic material 130 so as to provide the "bottom" of the openings 103. FIG. 3I illustrates an alternative embodiment of the IC device 316 where a gate dielectric 140 is provided as a continuous layer between the quantum well stack 146 and the insulating material 128. In some embodiments, such a gate dielectric 140 may be deposited as a part of the process 202 (i.e., in such embodiments, the gate dielectric for all of the gates of the quantum dot device 100 is provided by a common layer of gate dielectric material disposed between the quantum well stack 146 and the insulating material 128). In other embodiments, a gate dielectric 140 may be deposited individually in various openings 103 (i.e., in such embodiments, the gate dielectric may not be continuous across multiple ones of the gates of the quantum dot device 100), an example of which is shown with an inset 142 provided in FIG. 3I, illustrating an alternative implementation of two gates with individual gate dielectrics 140 at the bottom of the openings in the insulating material 128. In such embodiments, the gate dielectric 140 may be deposited individually in the openings as a part of the process 206, before the gate openings are filled with the magnetic material 130. In some embodiments, the gate dielectric 140 may be a multilayer gate dielectric (e.g., with multiple materials used to improve the interface between the openings 103 and the corresponding magnetic material provided in the openings 103 as a gate metal of a particular gate). The gate dielectric 140 may be, for example, silicon oxide, aluminum oxide, or a high-k dielectric, such as hafnium oxide. More generally, the gate dielectric 140 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 140 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 140 to improve the quality of the gate dielectric 140. The gate dielectric 140 may have a thickness that may, in some embodiments, be between about 0.5 nanometers and 3 nanometers, including all values and ranges therein (e.g., between about 1 and 3 nanometers, or between about 1 and 2 nanometers).

Figure 4:
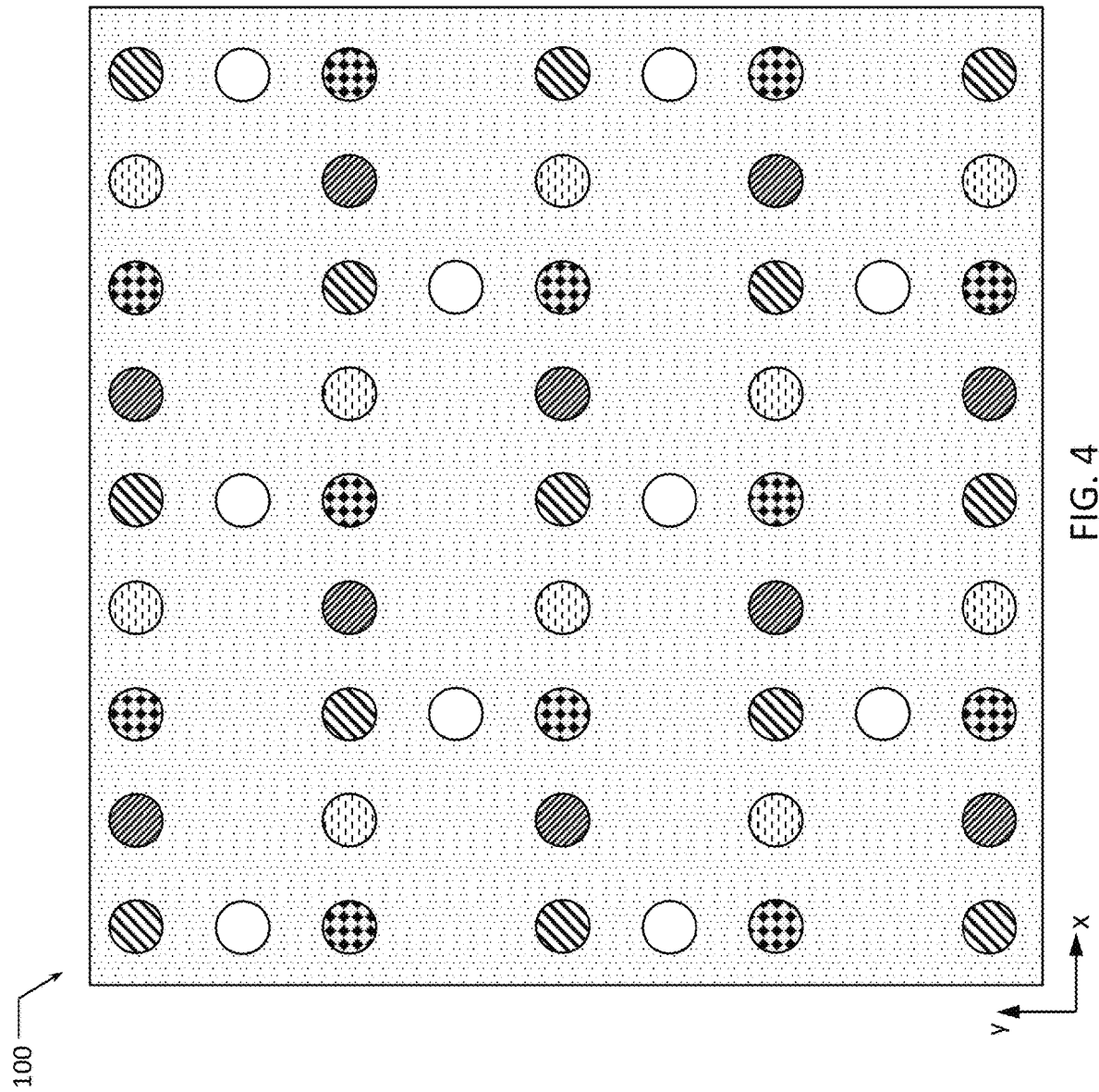
FIGS. 4-6 are top-down views of example quantum dot device with sparser arrays of magnetic gates, according to various embodiments.
Figure 5:
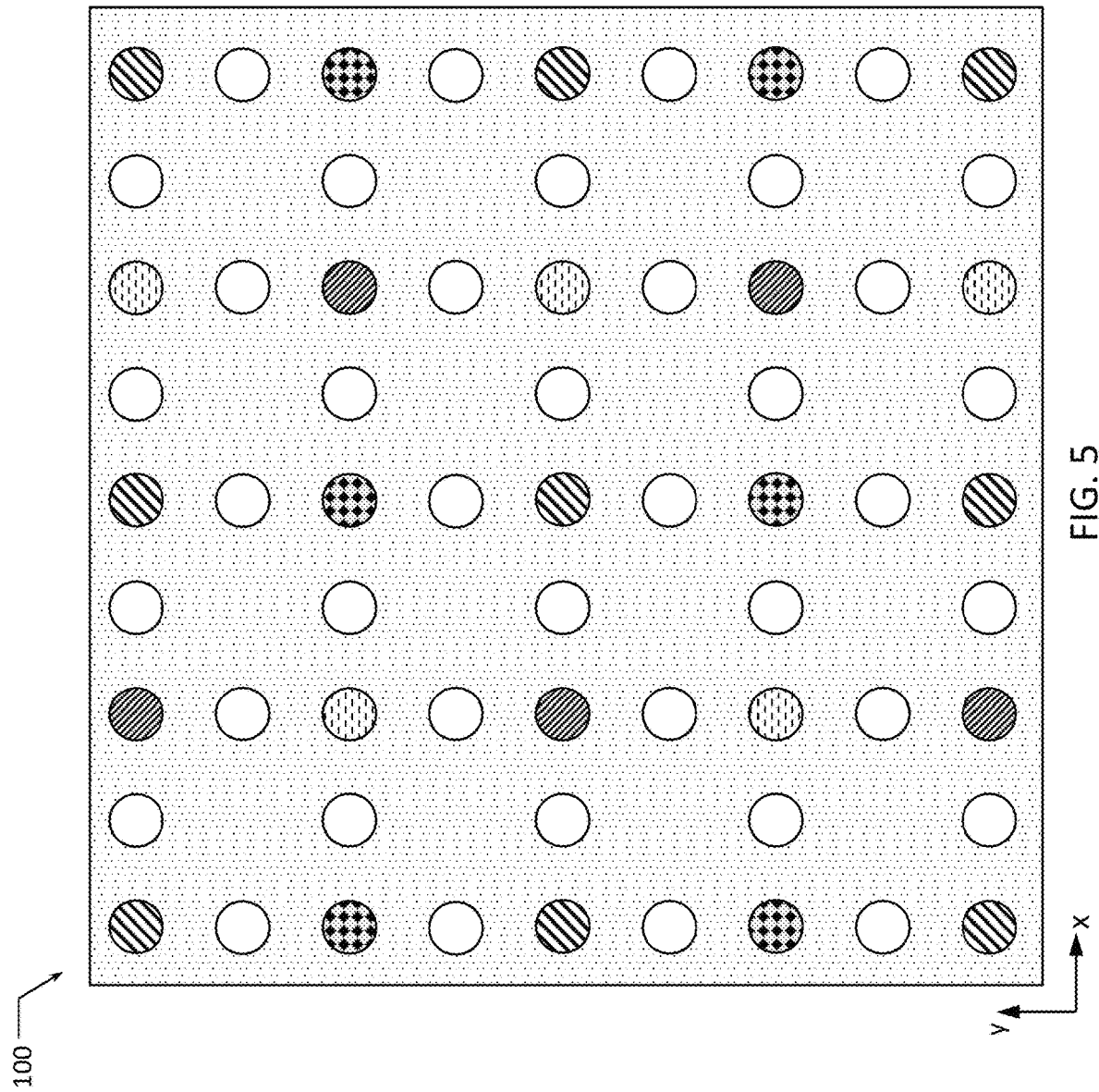
Figure 6:
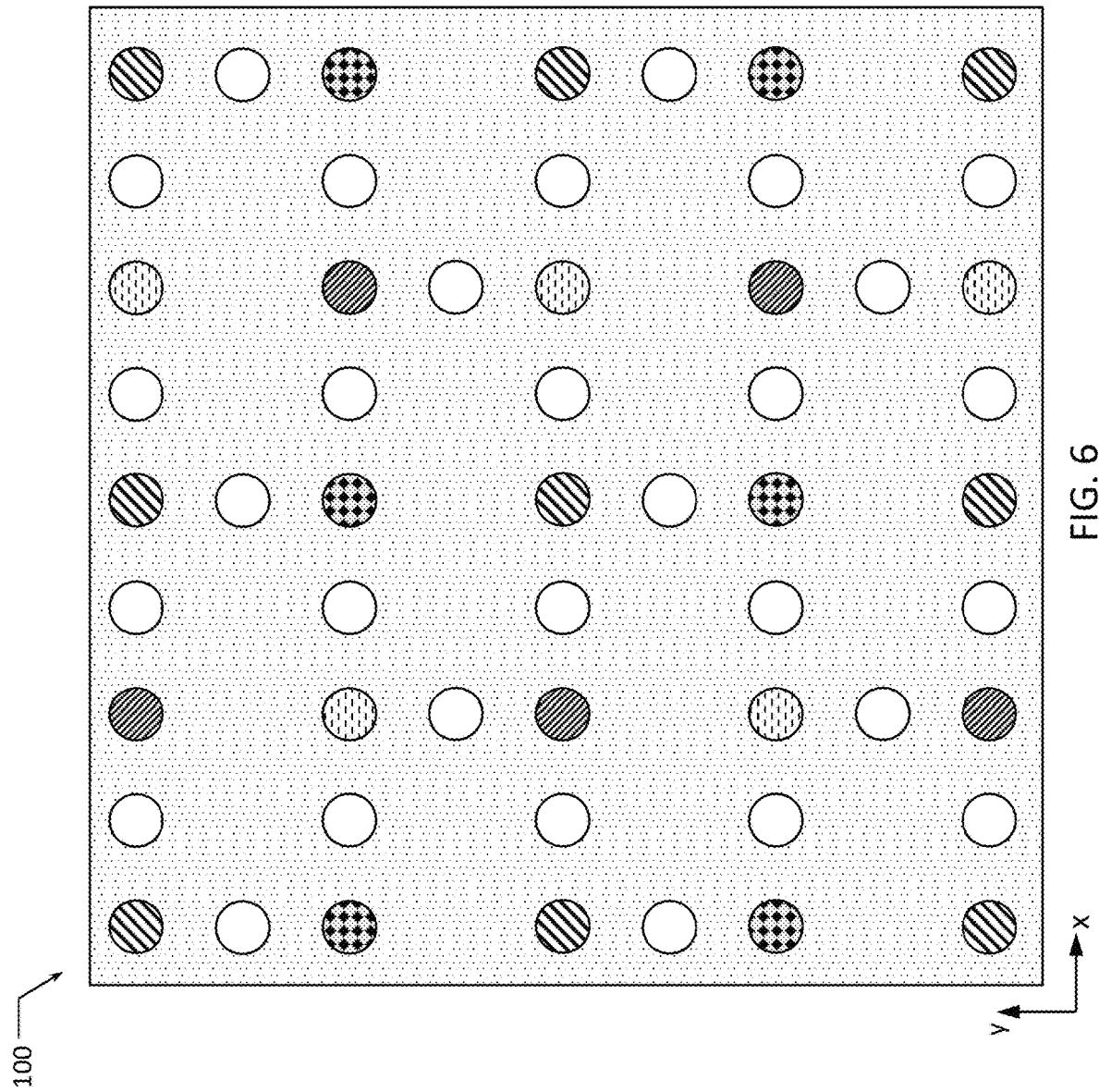

The method 200 may be used to manufacture the quantum dot device 100 as shown in FIG. 1. While FIG. 1 illustrates what may be referred to as a "dense array" because a gate is provided at each point of a two-dimensional grid, in other embodiments, the quantum dot device 100 may include what may be referred to as a "sparse array" or a "sparser array" (if compared to some point of reference) of gates, where some of the gates may be missing, compared to the dense array arrangement. FIGS. 4-6 are top-down views of example quantum dot device 100 with sparser arrays of magnetic gates, according to various embodiments. The method 200 may be used to manufacture the quantum dot device 100 as shown in FIGS. 4-6. The quantum dot device 100 shown in FIGS. 4-6 is substantially the same as shown in FIG. 1 (therefore, descriptions provided with respect to FIG. 1 are not repeated for each of FIGS. 4-6), but illustrating different example arrangements of the openings 103 with the magnetic materials 130 of different heights where the patterns of the quantum dot gates may be sparser than the pattern of FIG. 1. The white circles shown in FIGS. 4-6 illustrate the openings 103 which may be filled only with a non-ferromagnetic material, e.g., with any of the non-ferromagnetic materials 136, described above. FIGS. 4-6 further illustrate that some of the openings 103 present in the quantum dot device 100 of FIG. 1 may be absent in those of FIGS. 4-6 (i.e., no circles are shown in those locations of the quantum dot device 100 in FIGS. 4-6). In the quantum dot device 100 of FIG. 1, each quantum dot gate formed by the opening 103 may have 4 nearest neighbors (two nearest neighbors in the direction of the x-axis and two nearest neighbors in the direction of the x-axis). In the quantum dot device 100 of FIGS. 4-6, the quantum dot gates formed by some of the opening 103 may have less than 4 nearest neighbors e.g., 2 or 3 nearest neighbors). Compared to the quantum dot device 100 of FIG. 1, quantum dots that form under different ones of the quantum dot gates of FIGS. 4-6 may experience reduced interference from neighboring quantum dot gates, and thus may exhibit fewer undesirable, unintended interactions (at the expense of fewer quantum dot gates per unit area). Spacing two quantum dot gates further apart may reduce interference between the quantum dots associated with those quantum dot gates (e.g., due to the passive barrier provided by the intervening portion of the quantum well stack 146). The "sparse" arrangement of quantum dot gates in FIGS. 4-6 is simply illustrative, and any of the quantum dot gates may be missing or replaced with stubs in any suitable arrangement in any of the embodiments of quantum dot devices 100 disclosed herein.

As discussed above, the quantum well stack 146 may include a quantum well layer in which a 2DEG may form during operation of the quantum dot device 100. The quantum well stack 146 may take any of a number of forms, several of which are illustrated in FIGS. 7-9. The various layers in the quantum well stacks 146 discussed below may be grown on the support structure 102 (e.g., using epitaxial processes).

Although the singular term "layer" may be used to refer to various components of the quantum well stacks 146 of FIGS. 7-9, any of the layers discussed below may include multiple materials arranged in any suitable manner. In embodiments in which a quantum well stack 146 includes layers other than a quantum well layer 152, layers other than the quantum well layer 152 in a quantum well stack 146 may have higher threshold voltages for conduction than the quantum well layer 152 so that when the quantum well layer 152 is biased at its threshold voltages, the quantum well layer 152 conducts and the other layers of the quantum well stack 146 do not. This may avoid parallel conduction in both the quantum well layer 152 and the other layers, and thus avoid compromising the strong mobility of the quantum well layer 152 with conduction in layers having inferior mobility. In some embodiments, silicon used in a quantum well stack 146 (e.g., in a quantum well layer 152) may be grown from precursors enriched with the 28Si isotope. In some embodiments, germanium used in a quantum well stack 146 (e.g., in a quantum well layer 152) may be grown from precursors enriched with the 70Ge, 72Ge, or 74Ge isotope.

Figure 7:
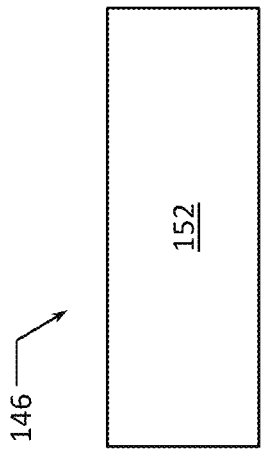
FIGS. 7-9 illustrate various embodiments of a quantum well stack that may be included in a quantum dot device with magnetic gates, in accordance with various embodiments.

FIG. 7 is a cross-sectional view of a quantum well stack 146 including only a quantum well layer 152. The quantum well layer 152 may be disposed on the support structure 102, and may be formed of a material such that, during operation of the quantum dot device 100, a 2DEG may form in the quantum well layer 152 proximate to the upper surface of the quantum well layer 152. The gate dielectric of the quantum dot gates of the quantum dot device 100 may be disposed on the upper surface of the quantum well layer 152. In some embodiments, the quantum well layer 152 of FIG. 7 may be formed of intrinsic silicon, and the gate dielectric may be formed of silicon oxide; in such an arrangement, during use of the quantum dot device 100, a 2DEG may form in the intrinsic silicon at the interface between the intrinsic silicon and the silicon oxide. Embodiments in which the quantum well layer 152 of FIG. 7 is formed of intrinsic silicon may be particularly advantageous for electron-type quantum dot devices 100. In some embodiments, the quantum well layer of FIG. 7 may be formed of intrinsic germanium, and the gate dielectric may be formed of germanium oxide; in such an arrangement, during use of the quantum dot device 100, a 2D hole gas (2DHG) may form in the intrinsic germanium at the interface between the intrinsic germanium and the germanium oxide. Such embodiments may be particularly advantageous for hole-type quantum dot devices 100. In some embodiments, the quantum well layer 152 may be strained, while in other embodiments, the quantum well layer 152 may not be strained. The thicknesses (i.e., z-heights) of the layers in the quantum well stack 146 of FIG. 7 may take any suitable values. For example, in some embodiments, the thickness of the quantum well layer 152 (e.g., intrinsic silicon or germanium) may be between about 0.8 microns and 1.2 microns.

Figure 8:
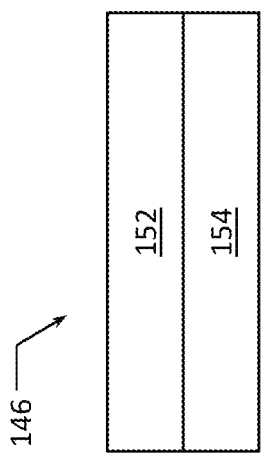

FIG. 8 is a cross-sectional view of a quantum well stack 146 including a quantum well layer 152 and a barrier layer 154. The quantum well stack 146 may be disposed on the support structure 102 such that the barrier layer 154 is disposed between the quantum well layer 152 and the support structure 102. The barrier layer 154 may provide a potential barrier between the quantum well layer 152 and the support structure 102. As discussed above with reference to FIG. 7, the quantum well layer 152 of FIG. 8 may be formed of a material such that, during operation of the quantum dot device 100, a 2DEG may form in the quantum well layer 152 proximate to the upper surface of the quantum well layer 152. For example, in some embodiments in which the support structure 102 is formed of silicon, the quantum well layer 152 of FIG. 8 may be formed of silicon, and the barrier layer 154 may be formed of silicon germanium. The germanium content of this silicon germanium may be about 20-80% (e.g., about 30%). In some embodiments in which the quantum well layer 152 is formed of germanium, the barrier layer 154 may be formed of silicon germanium, e.g., with a germanium content of about 20-80% (e.g., about 70%). The thicknesses (i.e., z-heights) of the layers in the quantum well stack 146 of FIG. 8 may take any suitable values. For example, in some embodiments, the thickness of the barrier layer 154 (e.g., silicon germanium) may be between about 0 nanometers and 400 nanometers. In some embodiments, the thickness of the quantum well layer 152 (e.g., silicon or germanium) may be between about 5 nanometers and 30 nanometers.

Figure 9:
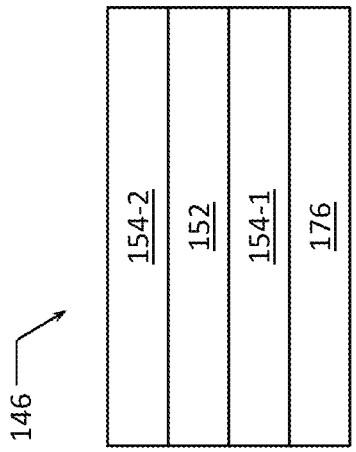

FIG. 9 is a cross-sectional view of a quantum well stack 146 including a quantum well layer 152 and a barrier layer 154-1, as well as a buffer layer 176 and an additional barrier layer 154-2. The quantum well stack 146 may be disposed on the support structure 102 such that the buffer layer 176 is disposed between the barrier layer 154-1 and the support structure 102. The buffer layer 176 may be formed of the same material as the barrier layer 154 and may be present to trap defects that form in this material as it is grown on the support structure 102. In some embodiments, the buffer layer 176 may be grown under different conditions (e.g., deposition temperature or growth rate) from the barrier layer 154-1. In particular, the barrier layer 154-1 may be grown under conditions that achieve fewer defects than the buffer layer 176. In some embodiments in which the buffer layer 176 includes silicon germanium, the silicon germanium of the buffer layer 176 may have a germanium content that varies from the support structure 102 to the barrier layer 154-1; for example, the silicon germanium of the buffer layer 176 may have a germanium content that varies from zero percent at the silicon support structure 102 to a nonzero percent (e.g., about 30%) at the barrier layer 154-1. The thicknesses (i.e., z-heights) of the layers in the quantum well stack 146 of FIG. 9 may take any suitable values. For example, in some embodiments, the thickness of the buffer layer 176 (e.g., silicon germanium) may be between about 0.3 microns and 4 microns (e.g., between about 0.3 microns and 2 microns, or about 0.5 microns). In some embodiments, the thickness of the barrier layer 154-1 (e.g., silicon germanium) may be between about 0 nanometers and 400 nanometers. In some embodiments, the thickness of the quantum well layer 152 (e.g., silicon or germanium) may be between about 5 nanometers and 30 nanometers (e.g., about 10 nanometers). The barrier layer 154-2, like the barrier layer 154-1, may provide a potential energy barrier around the quantum well layer 152, and may take the form of any of the embodiments of the barrier layer 154-1. In some embodiments, the thickness of the barrier layer 154-2 (e.g., silicon germanium) may be between about 25 nanometers and 75 nanometers (e.g., about 32 nanometers).

As discussed above with reference to FIG. 8, the quantum well layer 152 of FIG. 72 may be formed of a material such that, during operation of the quantum dot device 100, a 2DEG may form in the quantum well layer 152 proximate to the upper surface of the quantum well layer 152. For example, in some embodiments in which the support structure 102 is formed of silicon, the quantum well layer 152 of FIG. 9 may be formed of silicon, and the barrier layer 154-1 and the buffer layer 176 may be formed of silicon germanium. In some such embodiments, the silicon germanium of the buffer layer 176 may have a germanium content that varies from the support structure 102 to the barrier layer 154-1; for example, the silicon germanium of the buffer layer 176 may have a germanium content that varies from zero percent at the silicon support structure 102 to a nonzero percent (e.g., about 30%) at the barrier layer 154-1. In other embodiments, the buffer layer 176 may have a germanium content about equal to the germanium content of the barrier layer 154-1 but may be thicker than the barrier layer 154-1 so as to absorb the defects that arise during growth.

In some embodiments, the quantum well layer 152 of FIG. 9 may be formed of germanium, and the buffer layer 176 and the barrier layer 154-1 may be formed of silicon germanium. In some such embodiments, the silicon germanium of the buffer layer 176 may have a germanium content that varies from the support structure 102 to the barrier layer 154-1; for example, the silicon germanium of the buffer layer 176 may have a germanium content that varies from zero percent at the support structure 102 to a nonzero percent (e.g., about 70%) at the barrier layer 154-1. The barrier layer 154-1 may in turn have a germanium content equal to the nonzero percent. In other embodiments, the buffer layer 176 may have a germanium content about equal to the germanium content of the barrier layer 154-1 but may be thicker than the barrier layer 154-1 so as to absorb the defects that arise during growth. In some embodiments of the quantum well stack 146 of FIG. 9, the buffer layer 176 and/or the barrier layer 154-2 may be omitted.

Quantum dot devices with magnetic gates as described above may be implemented using any kind of qubit devices or be included in any kind of quantum processing devices/structures. Some examples of such devices/structures are illustrated in FIGS. 10-12.

Figure 10:
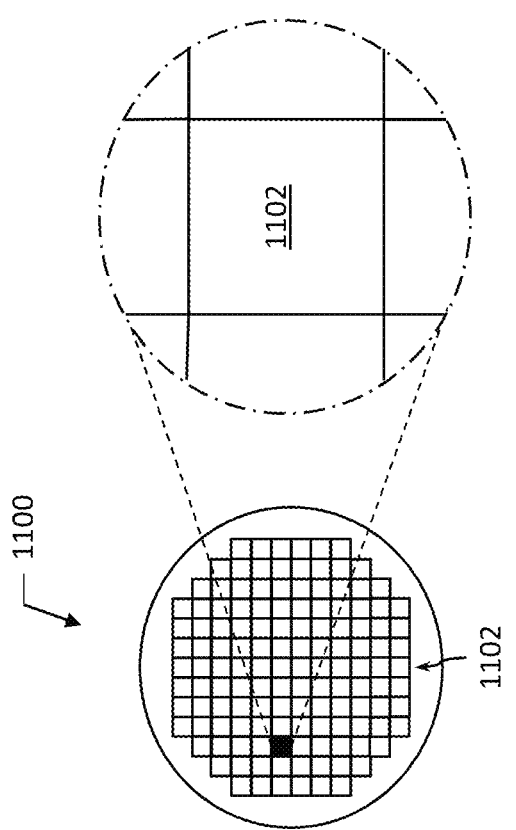
FIG. 10 is a top view of a wafer and dies that may include one or more of quantum dot devices disclosed herein.

FIG. 10 provides a top view of a wafer 1100 and dies 1102 that may be formed from the wafer 1100, according to some embodiments of the present disclosure. The dies 1102 may include any of the quantum dot devices with magnetic gates disclosed herein, e.g., any embodiments of the quantum dot device 100 disclosed herein, or any combination of such embodiments. The wafer 1100 may include semiconductor material and may include one or more dies 1102 having conventional and quantum circuit device elements formed on a surface of the wafer 1100. Each of the dies 1102 may be a repeating unit of a semiconductor product that includes any suitable conventional and/or quantum circuit qubit device. After the fabrication of the semiconductor product is complete, the wafer 1100 may undergo a singulation process in which each of the dies 1102 is separated from one another to provide discrete "chips" of the semiconductor product. A die 1102 may include, or be included in, a quantum circuit component. In some embodiments, the wafer 1100 or the die 1102 may include a memory device (e.g., a static random-access memory (SRAM) device), a logic device (e.g., AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 2002 of FIG. 12) or other logic that is configured to store information in the memory devices or execute instructions stored in the memory array.

Figure 11:
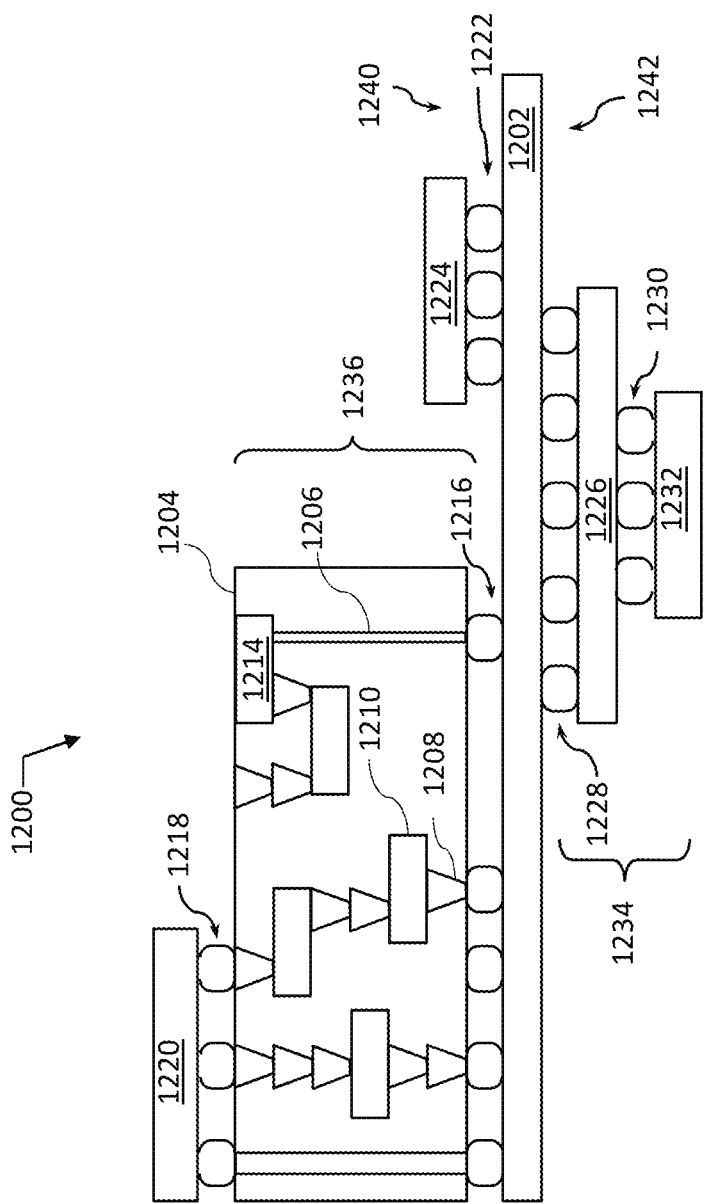
FIG. 11 is a cross-sectional side view of a device assembly that may include one or more of quantum dot devices disclosed herein.
Figure 12:
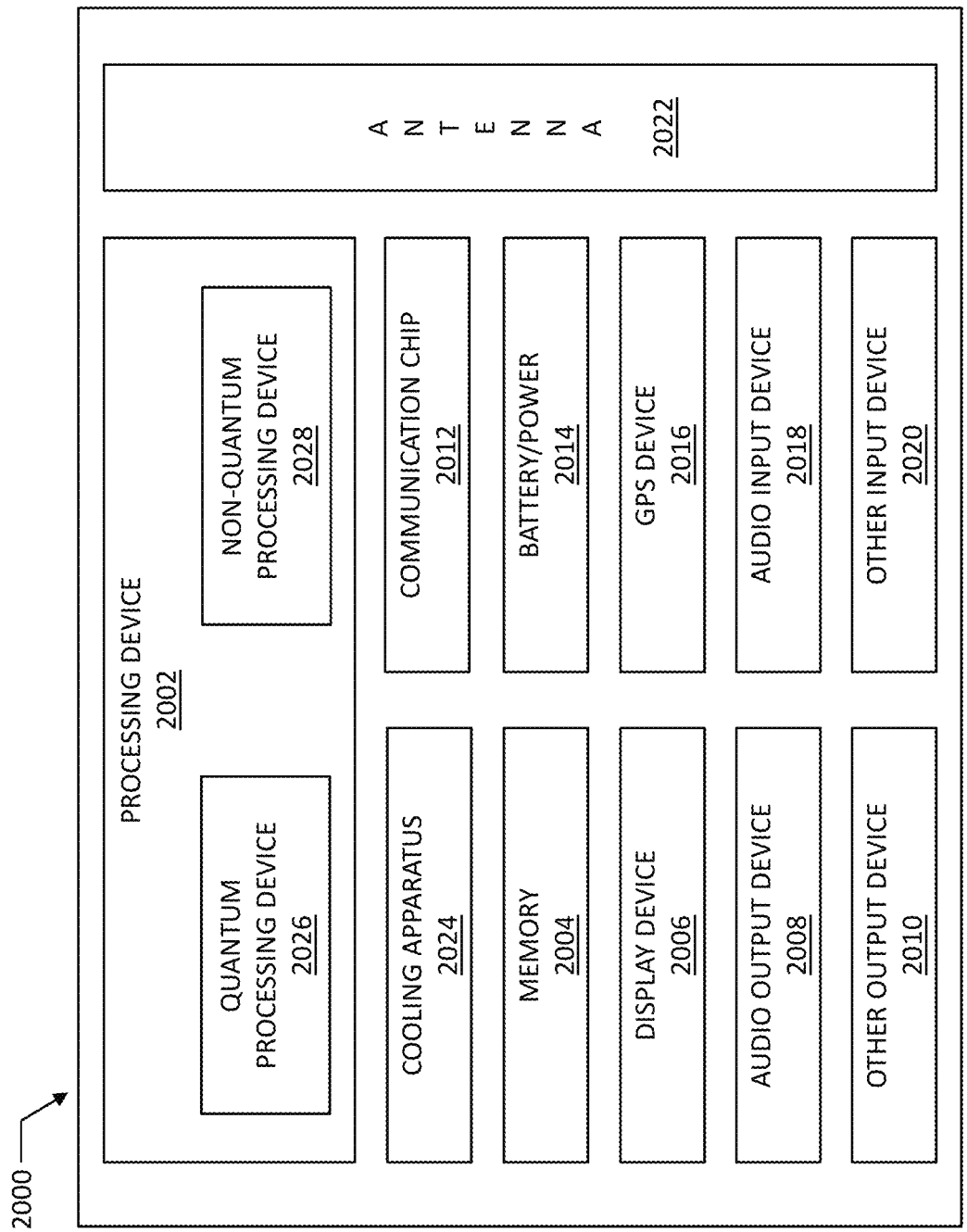
FIG. 12 is a block diagram of an example quantum computing device that may include one or more of quantum dot devices disclosed herein, in accordance with various embodiments.

FIG. 11 is a cross-sectional side view of a device assembly 1200 that may include any of the embodiments of the quantum dot devices with magnetic gates as disclosed herein. The device assembly 1200 includes a number of components disposed on a circuit board 1202. The device assembly 1200 may include components disposed on a first face 1240 of the circuit board 1202 and an opposing second face 1242 of the circuit board 1202; generally, components may be disposed on one or both faces 1240 and 1242.

In some embodiments, the circuit board 1202 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1202. In other embodiments, the circuit board 1202 may be a package substrate or flexible board.

The IC device assembly 1200 illustrated in FIG. 11 may include a package-on-interposer structure 1236 coupled to the first face 1240 of the circuit board 1202 by coupling components 1216. The coupling components 1216 may electrically and mechanically couple the package-on-interposer structure 1236 to the circuit board 1202 and may include solder balls (as shown in FIG. 11), male and female portions of a socket, an adhesive, an underfill material, and/or any other suitable electrical and/or mechanical coupling structure.

The package-on-interposer structure 1236 may include a package 1220 coupled to an interposer 1204 by coupling components 1218. The coupling components 1218 may take any suitable form for the application, such as the forms discussed above with reference to the coupling components 1216. Although a single package 1220 is shown in FIG. 11, multiple packages may be coupled to the interposer 1204; indeed, additional interposers may be coupled to the interposer 1204. The interposer 1204 may provide an intervening substrate used to bridge the circuit board 1202 and the package 1220. The package 1220 may be a quantum circuit device package as described herein, e.g., a package including any of the quantum dot devices with magnetic gates as described herein; or may be a conventional IC package, for example. Generally, the interposer 1204 may spread a connection to a wider pitch or reroute a connection to a different connection. For example, the interposer 1204 may couple the package 1220 (e.g., a die) to a ball grid array (BGA) of the coupling components 1216 for coupling to the circuit board 1202. In the embodiment illustrated in FIG. 11, the package 1220 and the circuit board 1202 are attached to opposing sides of the interposer 1204; in other embodiments, the package 1220 and the circuit board 1202 may be attached to a same side of the interposer 1204. In some embodiments, three or more components may be interconnected by way of the interposer 1204.

The interposer 1204 may be formed of an epoxy resin, a fiberglass-reinforced epoxy resin, a ceramic material, or a polymer material such as polyimide. In some embodiments, the interposer 1204 may be formed of alternate rigid or flexible materials that may include the same materials described above for use in a semiconductor substrate, such as silicon, germanium, and other group III-V and group IV materials. The interposer 1204 may include metal interconnects 1208 and vias 1210, including but not limited to through-silicon vias (TSVs) 1206. The interposer 1204 may further include embedded devices 1214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1204. The package-on-interposer structure 1236 may take the form of any of the package-on-interposer structures known in the art.

The device assembly 1200 may include a package 1224 coupled to the first face 1240 of the circuit board 1202 by coupling components 1222. The coupling components 1222 may take the form of any of the embodiments discussed above with reference to the coupling components 1216, and the package 1224 may take the form of any of the embodiments discussed above with reference to the package 1220. The package 1224 may be a package including any quantum dot devices with magnetic gates disclosed herein; or may be a conventional IC package, for example.

The device assembly 1200 illustrated in FIG. 11 includes a package-on-package structure 1234 coupled to the second face 1242 of the circuit board 1202 by coupling components 1228. The package-on-package structure 1234 may include a package 1226 and a package 1232 coupled together by coupling components 1230 such that the package 1226 is disposed between the circuit board 1202 and the package 1232. The coupling components 1228 and 1230 may take the form of any of the embodiments of the coupling components 1216 discussed above, and the packages 1226 and 1232 may take the form of any of the embodiments of the package 1220 discussed above. Each of the packages 1226 and 1232 may be a qubit device package as described herein or may be a conventional IC package, for example.

FIG. 12 is a block diagram of an example quantum computing device 2000 that may include any of the quantum dot devices with magnetic gates as disclosed herein, or any combinations of such quantum dot devices. Several components are illustrated in FIG. 12 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard), and may be included in, or include, any of the quantum circuits with any of the quantum dot devices with magnetic gates as described herein. In some embodiments, various ones of these components may be fabricated onto a single system-on-a-chip (SoC) die. Additionally, in various embodiments, the quantum computing device 2000 may not include one or more of the components illustrated in FIG. 12, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2018 or an audio output device 2008 but may include audio input or output device interface circuitry (e.g., connectors and supporting circuitry) to which an audio input device 2018 or audio output device 2008 may be coupled.

The quantum computing device 2000 may include a cooling apparatus 2024. The cooling apparatus 2024 may maintain a quantum processing device 2026 of the quantum computing device 2000, in particular the qubit devices as described herein, at a predetermined low temperature during operation to avoid qubit decoherence and to reduce the effects of scattering in the quantum processing device 2026. In some embodiments, a non-quantum processing device 2028 of the quantum computing device 2000 (and various other components of the quantum computing device 2000) may not be cooled by the cooling apparatus 2030 and may instead operate at room temperature.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include any of the quantum dot devices with magnetic gates as disclosed herein and may perform data processing by performing operations on the qubits that may be generated in the quantum dot devices 100, and monitoring the result of those operations. For example, as discussed above, different qubits may be allowed to interact, the quantum states of different qubits may be set or transformed, and the quantum states of different qubits may be read. The quantum processing device 2026 may be a universal quantum processor, or specialized quantum processor configured to run one or more quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random-access memory (DRAM)), nonvolatile memory (e.g., read-only memory (ROM)), flash memory, solid-state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random-access memory (eDRAM) or spin transfer torque magnetic random-access memory (STT-MRAM).

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data using modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2018 (or corresponding interface circuitry, as discussed above). The audio input device 2018 may include any device that generates a signal representative of a sound, such as microphones, microphone arrays, or digital instruments (e.g., instruments having a musical instrument digital interface (MIDI) output).

The quantum computing device 2000 may include a GPS device 2016 (or corresponding interface circuitry, as discussed above). The GPS device 2016 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide examples of various ones of the embodiments disclosed herein.

Example 1 provides a quantum dot device that includes a quantum well stack (146); an insulating material (128) over the quantum well stack; a first gate, including a first opening in the insulating material, the first opening extending to the quantum well stack and including a first magnetic material (130); and a second gate, including a second opening in the insulating material, the second opening extending to the quantum well stack and including a second magnetic material (130), where a height of the first magnetic material in the first opening is different from a height of the second magnetic material in the second opening, where the "height" refers to a dimension measured along a direction substantially perpendicular to the plane of the quantum well stack, and where the heights of the magnetic materials in the gate openings may be between about 2 nanometers and 500 nanometers.

Example 2 provides the quantum dot device according to example 1, where each of the first magnetic material and the second magnetic material is a ferromagnetic material.

Example 3 provides the quantum dot device according to examples 1 or 2, where the first magnetic material or the second magnetic material includes one or more of cobalt, nickel, iron, and an alloy of two or more of cobalt, nickel, and iron.

Example 4 provides the quantum dot device according to any one of the preceding examples, where the first opening further includes a non-ferromagnetic material (136), and the first magnetic material is between the quantum well stack and the non-ferromagnetic material.

Example 5 provides the quantum dot device according to example 4, where the non-ferromagnetic material includes one or more of ruthenium, palladium, platinum, hafnium, zirconium, titanium, tantalum, aluminum.

Example 6 provides the quantum dot device according to any one of the preceding examples, where a depth of the first opening or the second opening is between about 2 nanometers and 500 nanometers.

Example 7 provides the quantum dot device according to any one of the preceding examples, where a distance between the first opening and the second opening is between about 40 nanometers and 500 nanometers.

Example 8 provides the quantum dot device according to any one of the preceding examples, where material compositions of the first magnetic material and the second magnetic material are substantially same.

Example 9 provides the quantum dot device according to any one of the preceding examples, further including a gate dielectric (140) between the first magnetic material and the quantum well stack.

Example 10 provides the quantum dot device according to example 9, where the gate dielectric is a continuous layer that is a bottom of the first opening and a bottom of the second opening.

Example 11 provides the quantum dot device according to example 9, further including the gate dielectric between the second magnetic material and the quantum well stack, where the gate dielectric is absent in an area between the first opening and the second opening.

Example 12 provides the quantum dot device according to any one of the preceding examples, further including a third gate, including a third opening in the insulating material, where the third opening extends to the quantum well stack and includes a non-ferromagnetic material, and where the third opening does not include any ferromagnetic materials.

Example 13 provides the quantum dot device according to any one of the preceding examples, where the first gate and the second gate are gates of a plurality of gates arranged in a grid, and a number of nearest neighbor gates for the first gate is different from a number of nearest neighbor gates for the second gate.

Example 14 provides the quantum dot device according to any one of the preceding examples, where the quantum dot device is a quantum computing device that includes a quantum processing device, a non-quantum processing device, and a memory device; the quantum processing device includes the quantum well stack, the insulating material, the first gate, and the second gate; the non-quantum processing device is coupled to the quantum processing device and is to control voltages applied to one or more of the first gate and the second gate; and the memory device is to store data generated during operation of the quantum processing device.

Example 15 provides the quantum dot device according to example 14, further including a cooling apparatus to maintain a temperature of the quantum processing device below 5 degrees Kelvin.

Example 16 provides the quantum dot device according to examples 14 or 15, where the memory device is to store instructions for a quantum computing algorithm to be executed by the quantum processing device.

Example 17 provides a quantum dot device that includes a quantum well stack (146); an insulating material (128) over the quantum well stack; and an array of openings extending through the insulating material to the quantum well stack, where at least two of the openings include ferromagnetic materials of different heights.

Example 18 provides the quantum dot device according to example 17, where the two of the openings that include ferromagnetic materials further include a gate dielectric, and the gate dielectric is between the quantum well stack and the ferromagnetic materials.

Example 19 provides the quantum dot device according to examples 17 or 18, where the ferromagnetic materials include one or more of cobalt, nickel, iron, and an alloy of two or more of cobalt, nickel, and iron.

Example 20 provides the quantum dot device according to any one of examples 17-19, where at least some of the openings include a non-ferromagnetic material.

Example 21 provides the quantum dot device according to example 20, where the non-ferromagnetic material includes one or more of ruthenium, palladium, platinum, hafnium, zirconium, titanium, tantalum, aluminum.

Example 22 provides the quantum dot device according to any one of examples 17-21, where a depth of the openings is between about 2 nanometers and 500 nanometers.

Example 23 provides the quantum dot device according to any one of examples 17-22, where a distance between adjacent openings is between about 40 nanometers and 500 nanometers.

Example 24 provides a method of manufacturing a quantum dot device, the method including: providing a quantum well stack; providing an insulating material over the quantum well stack; forming a plurality of openings extending through the insulating material to the quantum well stack; depositing a ferromagnetic material in the openings; and recessing the ferromagnetic material in at least some of the openings so that at least two of the openings include the ferromagnetic material of different heights.

Example 25 provides the method according to example 24, further including: filling the openings in which the ferromagnetic material was recessed with a non-ferromagnetic material.

Example 26 provides the method according to examples 24 or 25, where recessing the ferromagnetic material is performed in iterations and using a mask, in each iteration the ferromagnetic material is recessed to a same height in openings that are not covered by the mask, and for at least two of the iterations heights to which the ferromagnetic material is recessed are different.

Example 27 provides the method according to any one of examples 24-26, further including processes to manufacture the quantum dot device according to any one of the preceding examples (e.g., any of examples 1-23).

Example 28 provides an IC package that includes an IC die, including a quantum dot device according to any one of the preceding examples (e.g., any one of examples 1-23); and a further component, coupled to the IC die.

Example 29 provides the IC package according to example 28, where the further component is one of a package substrate, an interposer, or a further IC die.

Example 30 provides the IC package according to any one of examples 28-29, where the further component is coupled to the IC die via one or more first level interconnects, and the one or more first level interconnects include one or more solder bumps, solder posts, or bond wires.

Example 31 provides a quantum dot device with magnetic gates as described herein.

Example 32 provides the quantum dot device according to example 31, where at least two of the magnetic gates have magnetic materials of different heights.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A quantum dot device, comprising:
    a quantum well stack;
    an insulating material over the quantum well stack;
    a first gate, comprising a first opening in the insulating material, the first opening extending towards the quantum well stack and comprising a first magnetic material; and
    a second gate, comprising a second opening in the insulating material, the second opening extending towards the quantum well stack and comprising a second magnetic material,
    wherein a height of the first magnetic material in the first opening is different from a height of the second magnetic material in the second opening.

2. The quantum dot device according to claim 1, wherein at least one of the first magnetic material and the second magnetic material is a ferromagnetic material.

3. The quantum dot device according to claim 1, wherein the first magnetic material or the second magnetic material includes one or more of cobalt, nickel, iron, and an alloy of two or more of cobalt, nickel, and iron.

4. The quantum dot device according to claim 1, wherein:
    the first opening further includes a non-ferromagnetic material, and
    the first magnetic material is between the quantum well stack and the non-ferromagnetic material.

5. The quantum dot device according to claim 4, wherein the non-ferromagnetic material includes one or more of ruthenium, palladium, platinum, hafnium, zirconium, titanium, tantalum, aluminum.

6. The quantum dot device according to claim 1, further comprising a gate dielectric between the first magnetic material and the quantum well stack.

7. The quantum dot device according to claim 6, wherein the gate dielectric is a continuous layer that is a bottom of the first opening and a bottom of the second opening.

8. The quantum dot device according to claim 7, wherein the second opening extends to the gate dielectric.

9. The quantum dot device according to claim 6, further comprising the gate dielectric between the second magnetic material and the quantum well stack, wherein the gate dielectric is absent in an area between the first opening and the second opening.

10. The quantum dot device according to claim 9, wherein the second opening extends to the gate dielectric.

11. The quantum dot device according to claim 6, wherein the first opening extends to the gate dielectric.

12. The quantum dot device according to claim 1, further comprising a third gate that includes a third opening in the insulating material, wherein the third opening extends to the quantum well stack and includes a non-ferromagnetic material, and the third opening does not include any ferromagnetic materials.

13. The quantum dot device according to claim 1, wherein:
    the first gate and the second gate are gates of a plurality of gates arranged in a grid, and
    a number of nearest neighbor gates for the first gate is different from a number of nearest neighbor gates for the second gate.

14. A quantum dot device according to claim 1, wherein:
    the quantum dot device is a quantum computing device that includes a quantum processing device, a non-quantum processing device, and a memory device,
    the quantum processing device includes the quantum well stack, the insulating material, the first gate, and the second gate,
    the non-quantum processing device is coupled to the quantum processing device and is to control voltages applied to one or more of the first gate and the second gate, and
    the memory device is to store data generated during operation of the quantum processing device.

15. The quantum dot device according to claim 1, wherein at least one of the first opening and the second opening extends to the quantum well stack.

16. A quantum dot device, comprising:
    a quantum well stack;
    an insulating material over the quantum well stack; and
    an array of openings extending through the insulating material towards the quantum well stack,
    wherein at least two of the openings include ferromagnetic materials of different heights.

17. The quantum dot device according to claim 16, wherein:
    the two of the openings that include ferromagnetic materials further include a gate dielectric, and
    the gate dielectric is between the quantum well stack and the ferromagnetic materials.

18. A quantum dot device, comprising:
    a quantum well stack;
    an insulating material over the quantum well stack;
    a first gate, comprising a first opening in the insulating material, the first opening extending towards the quantum well stack and comprising a first magnetic material; and a second gate, comprising a second opening in the insulating material, the second opening extending towards the quantum well stack and comprising a second magnetic material, wherein an average width of the first magnetic material in the first opening is different from an average width of the second magnetic material in the second opening.

19. The quantum dot device according to claim 18, wherein at least one of the first opening and the second opening extends to the quantum well stack.

20. The quantum dot device according to claim 18, further comprising a gate dielectric between the first magnetic material and the quantum well stack, wherein the first opening extends to the gate dielectric.

* * * * *